US012787256B2

(12) United States Patent
Kim

(10) Patent No.: US 12,787,256 B2
(45) Date of Patent: Nov. 3, 2026

(54) SEMICONDUCTOR DEVICE

(71) Applicant: SAMSUNG ELECTRONICS CO., LTD., Suwon-si (KR)

(72) Inventor: Youngwoo Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 406 days.

(21) Appl. No.: 18/370,905

(22) Filed: Sep. 21, 2023

(65) Prior Publication Data

US 2024/0130110 A1 Apr. 18, 2024

(30) Foreign Application Priority Data

Oct. 14, 2022 (KR) ........................ 10-2022-0132725

(51) Int. Cl.
*H10B 12/00* (2023.01)

(52) U.S. Cl.
CPC ........... *H10B 12/34* (2023.02); *H10B 12/053* (2023.02); *H10B 12/315* (2023.02); *H10B 12/488* (2023.02)

(58) Field of Classification Search
CPC ...... H10D 89/10; H10B 12/34; H10B 12/053; H10B 12/315; H10B 12/488; H10B 12/00
See application file for complete search history.

(56) References Cited

U.S. PATENT DOCUMENTS 7,535,057 B2 5/2009 Yang
7,979,829 B2 7/2011 Smayling
9,355,209 B2 5/2016 Chuang et al.
9,362,422 B2 6/2016 Lim
9,418,716 B1 * 8/2016 Pallerla .................... G11C 5/14
10,439,048 B2 10/2019 Lim et al.
10,727,276 B1 * 7/2020 Lien ...................... H10N 70/24
10,734,401 B1 * 8/2020 Kim ...................... H10B 41/50
10,847,641 B2 11/2020 Abe et al.
2015/0019802 A1 * 1/2015 Kamal .................. G11C 5/025 711/104
2015/0117088 A1 * 4/2015 Kunitake ............... G11C 5/025 365/148
2015/0340313 A1 * 11/2015 Choi ................. H10B 12/0335 257/773
2018/0033798 A1 * 2/2018 Baraskar ................ H10B 43/10
2018/0082751 A1 * 3/2018 Umezawa ............. G11C 5/147

(Continued)

FOREIGN PATENT DOCUMENTS

KR 10-2017-0042430 A 4/2017

*Primary Examiner* — Mohsen Ahmadi
(74) *Attorney, Agent, or Firm* — Muir Patent Law, PLLC

(57) ABSTRACT

A semiconductor device includes a substrate, an isolation layer defining an active region in the substrate, a word line extending in a first horizontal direction in a first area of the substrate, a bit line extending in a second horizontal direction perpendicular to the first horizontal direction, on the substrate, and a plurality of first dummy word lines provided in a second area of the substrate adjacent in the second horizontal direction to a first end portion of the first area in the first horizontal direction, the plurality of first dummy word lines extending in the first horizontal direction, wherein a length of each of the plurality of first dummy word lines in the first horizontal direction is less than a length of the word line in the first horizontal direction.

11 Claims, 34 Drawing Sheets

1

(56) References Cited

U.S. PATENT DOCUMENTS

| | | | | |
|---|---|---|---|---|
| 2018/0261613 | A1* | 9/2018 | Ariyoshi | H10B 41/27 |
| 2018/0267743 | A1* | 9/2018 | Park | G06F 12/08 |
| 2018/0286919 | A1* | 10/2018 | Terai | H10B 63/24 |
| 2019/0088587 | A1* | 3/2019 | Takekida | H10B 43/27 |
| 2019/0097030 | A1 | 3/2019 | Miyata et al. | |
| 2020/0168263 | A1* | 5/2020 | Miyakawa | G11C 13/0026 |
| 2021/0124258 | A1* | 4/2021 | Ahn | G03F 1/70 |
| 2021/0193664 | A1* | 6/2021 | Seong | H10B 12/34 |
| 2021/0296337 | A1* | 9/2021 | Hagishima | H10B 41/27 |
| 2021/0358918 | A1* | 11/2021 | Lu | H10B 12/033 |
| 2022/0139456 | A1* | 5/2022 | Lim | G11C 16/0483<br>257/314 |
| 2022/0157372 | A1* | 5/2022 | He | G11C 7/1042 |
| 2022/0172796 | A1 | 6/2022 | Ho et al. | |
| 2022/0284953 | A1* | 9/2022 | Takashima | G11C 13/0002 |
| 2022/0293510 | A1* | 9/2022 | Honda | G11C 8/14 |
| 2022/0302170 | A1* | 9/2022 | Suzuki | H10B 43/20 |
| 2022/0406364 | A1* | 12/2022 | Yabe | G11C 11/4082 |
| 2023/0298647 | A1* | 9/2023 | Sugiura | H10B 61/00<br>365/158 |
| 2024/0138156 | A1* | 4/2024 | Chia | H10B 10/125 |
| 2024/0363170 | A1* | 10/2024 | Norizuki | G11C 16/0483 |

* cited by examiner

SEMICONDUCTOR DEVICE

CROSS-REFERENCE TO RELATED APPLICATION

Korean Patent Application No. 10-2022-0132725, filed on Oct. 14, 2022, in the Korean Intellectual Property Office, is incorporated by reference herein in its entirety.

BACKGROUND

1. Field

A semiconductor device, particularly, to a semiconductor device including a word line contact is disclosed.

2. Description of the Related Art

As the electronics industry advances rapidly and the demands of users increase, electronic devices are being more and more miniaturized and made lighter in weight.

SUMMARY

Embodiments are directed to a semiconductor device including a substrate, an isolation layer defining an active region in the substrate, a word line extending in a first horizontal direction in a first area of the substrate, a bit line extending in a second horizontal direction perpendicular to the first horizontal direction on the substrate, a plurality of first dummy word lines provided in a second area of the substrate adjacent to a first end portion, provided in the first area in the first horizontal direction, in the second horizontal direction to extend in the first horizontal direction, wherein a length of each of the plurality of first dummy word lines in the first horizontal direction is less than a length of the word line in the first horizontal direction.

Embodiments are also directed to a semiconductor device including a substrate, a word line extending in a first horizontal direction in a first area of the substrate, a bit line extending in a second horizontal direction perpendicular to the first horizontal direction on the substrate, a dummy word line provided in a second area of the substrate adjacent to an end portion, provided in the first area in the first horizontal direction, in the second horizontal direction in terms of a plane, and an active region in an active region patterning area overlapping a portion of the first area of the substrate in terms of a plane, wherein the active region patterning area include a third area which does not overlap the first area in terms of a plane, and a length of the second area in the first horizontal direction, and a length of the third area in the first horizontal direction is less than a length of the first area in the first horizontal direction.

Embodiments are directed to a semiconductor device including a substrate, a word line extending in a first horizontal direction in a first area of the substrate, a bit line extending in a second horizontal direction perpendicular to the first horizontal direction on the substrate, a first dummy word line provided in a first sub-area of the substrate adjacent to an end portion, provided in the first area in the first horizontal direction, in the second horizontal direction in terms of a plane, a second dummy word line provided in a third sub-area apart from the first sub-area in the first horizontal direction, a third dummy word line provided in a second sub-area apart from the first sub-area in the second horizontal direction with the first area therebetween, a fourth dummy word line provided in a fourth sub-area apart from the second sub-area in the second horizontal direction with the first area therebetween, and an active region in an active region patterning area overlapping a portion of the first area of the substrate in terms of a plane, wherein the active region patterning area includes a third area which does not overlap the first area in terms of a plane, and the first to fourth sub-areas do not one-dimensionally overlap the third area adjacent to each of the first to fourth sub-areas.

BRIEF DESCRIPTION OF THE DRAWINGS

Features will become apparent to those of skill in the art by describing in detail exemplary embodiments with reference to the attached drawings, wherein.

DETAILED DESCRIPTION

Hereinafter, embodiments will be described in detail with reference to the accompanying drawings.

Figure 1:
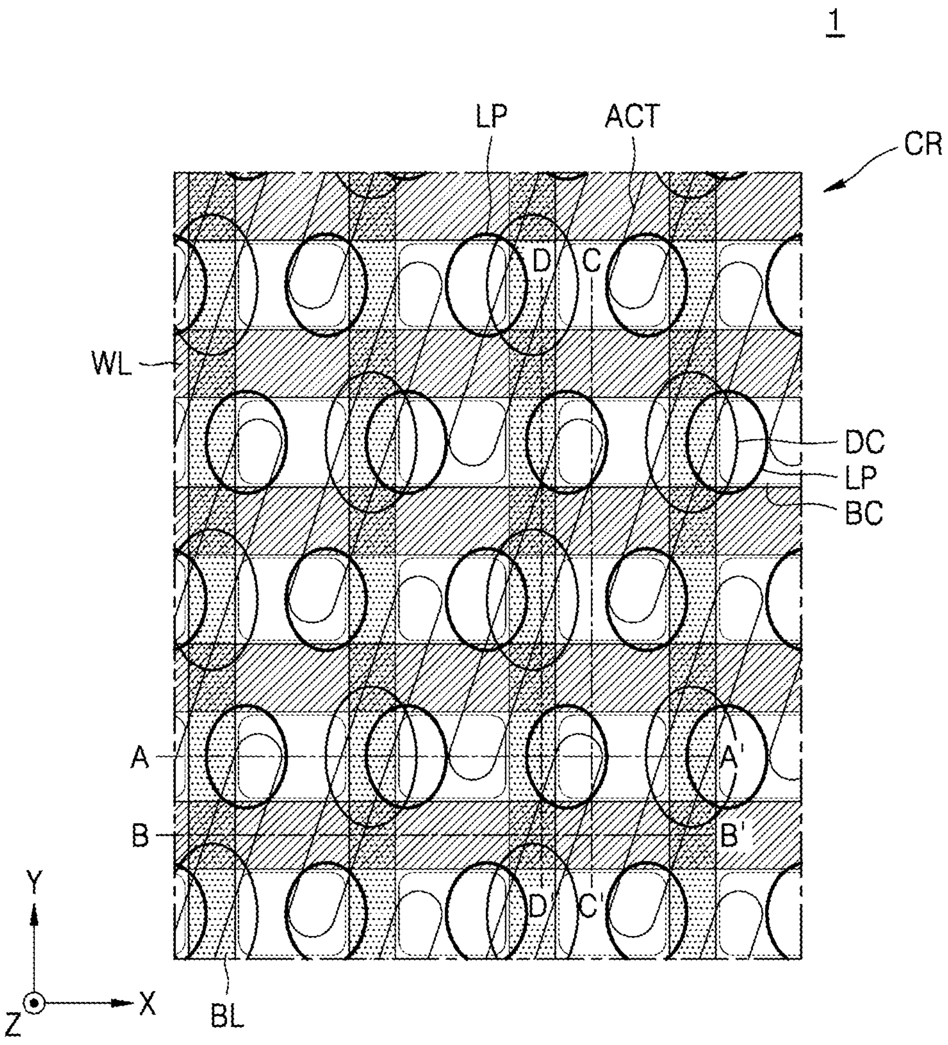
FIG. 1 is a schematic plan layout of a semiconductor device according to example embodiments.

FIG. 1 is a schematic plan layout showing main elements of a semiconductor device 1 according to example embodiments. FIGS. 2A to 2D are cross-sectional views showing a semiconductor device according to embodiments. In detail, FIGS. 2A, 2B, 2C, and 2D are cross-sectional views taken along line A-A', line B-B', line C-C', and line D-D' of FIG. 1.

Referring to FIG. 1, the semiconductor device 1 may include a plurality of active regions ACT in a memory cell region CR. In some embodiments, the plurality of active regions ACT in the memory cell region CR may be arranged to each have a long axis in a diagonal direction with respect to a first horizontal direction (an X direction) and a second horizontal direction (a Y direction). The plurality of active regions ACT may configure a plurality of active regions 118 illustrated in FIGS. 2A to 2D.

A plurality of word lines WL may extend in parallel in the first horizontal direction (the X direction) across the plurality of active regions ACT. A plurality of bit lines BL may extend in parallel in the second horizontal direction (the Y direction) intersecting with the first horizontal direction (the X direction) on the plurality of word lines WL.

In some embodiments, a plurality of buried contacts BC between two adjacent bit lines BL of the plurality of bit lines BL may be formed. In some embodiments, the plurality of buried contacts BC may be arranged in one row in each of the first horizontal direction (the X direction) and the second horizontal direction (the Y direction).

A plurality of landing pads LP may be on the plurality of buried contacts BC. The plurality of landing pads LP may be to at least partially overlap the plurality of buried contacts BC. In some embodiments, the plurality of landing pads LP may extend up to an upper portion of one bit line BL of two adjacent bit lines BL.

A plurality of storage nodes may be on the plurality of landing pads LP. The plurality of storage nodes may be on the plurality of bit lines BL. The plurality of storage nodes may respectively be lower electrodes of a plurality of capacitors. The storage node may be connected with the active region ACT through the landing pad LP and the buried contact BC. The semiconductor device 1 may be a dynamic random access memory (DRAM) device.

Referring to FIGS. 2A to 2D, the semiconductor device 1 may include a plurality of active regions 118 defined by an isolation layer 116 and may include a substrate 110 including a plurality of word line trenches 120T crossing the plurality of active regions 118, a plurality of word lines 120 respectively in the plurality of word line trenches 120T, a plurality of bit line structures 140, and a plurality of capacitor structures 200 each including a plurality of lower electrodes 210, a capacitor dielectric layer 220, and an upper electrode 230.

The substrate 110 may include, e.g., silicon (Si), crystalline Si, polycrystalline Si, or amorphous Si. In some other embodiments, the substrate 10 may include a semiconductor element, such as germanium (Ge), or silicon germanium (SiGe), silicon carbide (SiC), gallium arsenide (GaAs), indium arsenide (InAs), or indium phosphide (InP). In some embodiments, the substrate 110 may have a silicon on insulator (SOI) structure. In an implementation, the substrate 110 may include a buried oxide (BOX) layer. The substrate 110 may include a conductive region (e.g., an impurity-doped well or an impurity-doped structure). As used herein, the term “or” is not an exclusive term, e.g., “A or B” would include A, B, or A and B.

Each of the plurality of active regions 118 may be a portion of the substrate 110 limited by a device isolation trench 116T. The plurality of active regions 118 may have a relatively long island shape having a short axis and a long axis one-dimensionally. In some embodiments, the plurality of active regions 118 may be arranged to have a long axis in a diagonal direction with respect to the first horizontal direction (the X direction) and the second horizontal direction (the Y direction). The plurality of active regions 118 may extend to have substantially the same length in a long-axis direction and may be repeatedly arranged to have substantially a certain pitch.

The isolation layer 116 may fill the device isolation trench 116T. The plurality of active regions 118 may be defined in the substrate 110 by the isolation layer 116.

In some embodiments, the isolation layer 116 may include a triple layer including a first device isolation layer, a second device isolation layer, and a third device isolation layer. In an implementation, the first device isolation layer may conformally cover an inner surface and a lower surface of the device isolation trench 116T. In some embodiments, the first device isolation layer may include silicon oxide. In an implementation, the second device isolation layer may conformally cover the first device isolation layer. In some embodiments, the second device isolation layer may include silicon nitride. In an implementation, the third device isolation layer may cover the second device isolation layer and may fill the device isolation trench 116T. In some embodiments, the third device isolation layer may include silicon oxide. In an implementation, the third device isolation layer may include silicon oxide including tonen silazene (TOSZ). In some embodiments, the isolation layer 116 may include a single layer including one kind of insulation layer, a double layer including two kinds of insulation layers, or a multi-layer including a combination of at least four kinds of insulation layers. In an implementation, the isolation layer 116 may include a single layer including silicon oxide.

The plurality of word line trenches 120T may be in the substrate 110 and may include the plurality of active regions 118 defined by the isolation layer 116. The plurality of word line trenches 120T may extend in parallel in the first horizontal direction (the X direction) and may have a line shape which is arranged to have substantially an equal interval in the second horizontal direction (the Y direction) across the active region 118. In some embodiments, a step height may be in lower surfaces of the plurality of word line trenches 120T.

A plurality of gate dielectric layers 122, the plurality of word lines 120, and a plurality of dummy buried insulation layers 124 may be sequentially formed in the plurality of word line trenches 120T. The plurality of word lines 120 may configure the plurality of word lines WL illustrated in FIG. 1. The plurality of word lines 120 may extend in parallel in the first horizontal direction (the X direction) and may have a line shape which is arranged to have substantially an equal interval in the second horizontal direction (the Y direction) across the active region 118. An upper surface of each of the plurality of word lines 120 may be at a vertical level which may be lower than an upper surface of the substrate 110. A lower surface of each of the plurality of word lines 120 may have a concave-convex shape, and a transistor having a saddle fin structure (saddle FINFET) may be in the plurality of active regions 118.

Each of the plurality of word lines 120 may fill a portion of a lower portion of a corresponding word line trench 120T of the plurality of word line trenches 120T. Each of the plurality of word lines 120 may have a stack structure of a lower word line layer 120*a* and an upper word line layer 120*b*. In an implementation, the lower word line layer 120*a* may conformally cover an inner sidewall and a lower surface of a portion of a lower portion of the word line trench 120T with the gate dielectric layer 122 therebetween. In an implementation, the upper word line layer 120*b* may cover the lower word line layer 120*a* and may fill a portion of a lower portion of the word line trench 120T with the gate dielectric layer 122 therebetween. In some embodiments, the lower word line layer 120*a* may include conductive metal nitride or a metal material such as titanium (Ti), titanium nitride (TiN), tantalum (Ta), or tantalum nitride (TaN). In some embodiments, the upper word line layer 120*b* may include, e.g., doped polysilicon, a metal material such as tungsten (W), conductive metal nitride such as tungsten nitride (WN), titanium silicon nitride (TiSiN), or tungsten silicon nitride (WSiN).

A source region and a drain region formed by implanting impurity ions into a portion of the active region 118 may be in a portion of the active region 118 of the substrate 110 at both sides of each of the plurality of word lines 120.

The gate dielectric layer 122 may cover the inner sidewall and the lower surface of the word line trench 120T. In some embodiments, the gate dielectric layer 122 may extend up to a region between the dummy buried insulation layer 124 and the word line trench 120T from a region between the word line 120 and the word line trench 120T. The gate dielectric layer 122 may include silicon oxide, silicon nitride, silicon oxynitride, oxide/nitride/oxide (ONO), or a high-k dielectric material having a dielectric constant which is greater than that of the silicon oxide. In an implementation, the gate dielectric layer 122 may have a dielectric constant of about 10 to about 25. In some embodiments, the gate dielectric layer 122 may include hafnium oxide (HfO), hafnium silicate (HfSiO), hafnium oxide nitride (HfON), hafnium silicon oxide nitride (HfSiON), lanthanum oxide (LaO), lanthanum aluminum oxide (LaAlO), zirconium oxide (ZrO), zirconium silicon oxide (ZrSiO), zirconium oxide nitride (ZrON), zirconium silicon oxide nitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), or lead scandium tantalum oxide (PbScTaO). In an implementation, the gate dielectric layer 122 may include $HfO_2$, $Al_2O_3$, $HfAlO_3$, $Ta_2O_3$, or $TiO_2$.

Each of the plurality of dummy buried insulation layers 124 may fill a portion of an upper portion of a corresponding word line trench 120T of the plurality of word line trenches 120T. In some embodiments, an upper surface of each of the plurality of dummy buried insulation layers 124 may be at substantially the same vertical level as the upper surface of the substrate 110. The dummy buried insulation layer 124 may include silicon oxide, silicon nitride, or silicon oxynitride. In an implementation, the dummy buried insulation layer 124 may include silicon nitride.

A plurality of insulation layer patterns 112 and 114 may be on the isolation layer 116, the plurality of active regions 118, and the plurality of dummy buried insulation layers 124. In an implementation, the plurality of insulation layer patterns 112 and 114 may include silicon oxide, silicon nitride, silicon oxynitride, a metal-based dielectric material. In some embodiments, the plurality of insulation layer patterns 112 and 114 may be in a stack structure of a plurality of insulation layers including a first insulation layer pattern 112 and a second insulation layer pattern 114. In some embodiments, the first insulation layer pattern 112 may include silicon oxide, and the second insulation layer pattern 114 may include silicon oxynitride. In some other embodiments, the first insulation layer pattern 112 may include a nonmetal-based dielectric material, and the second insulation layer pattern 114 may include a metal-based dielectric material. In some embodiments, the second insulation layer pattern 114 may be thicker than the first insulation layer pattern 112. In an implementation, the first insulation layer pattern 112 may have a thickness of about 50 Å to about 90 Å, and the second insulation layer pattern 114 may be thicker than the first insulation layer pattern 112 and may have a thickness of about 60 Å to about 100 Å.

A plurality of direct contact conductive patterns 134 may pass through the first and second insulation layer patterns 112 and 114 and may fill partial portions of a plurality of direct contact holes 134H exposing source regions of the active regions 118, respectively. In some embodiments, the direct contact hole 134H may elongate to the inside of the active region 118 (i.e., the inside of the source region). The direct contact conductive pattern 134 may include, e.g., doped polysilicon. In some embodiments, the direct contact conductive pattern 134 may include an epitaxial silicon layer. The plurality of direct contact conductive patterns 134 may configure the plurality of direct contacts DC illustrated in FIG. 1.

A plurality of bit line structures 140 may be on the insulation layer patterns 112 and 114. Each of the plurality of bit line structures 140 may include a bit line 147 and an insulation capping line 148 covering the bit line 147. The plurality of bit line structures 140 may extend in the second horizontal direction (the Y direction) parallel to a main surface of the substrate 110 in parallel. The plurality of bit lines 147 may configure the plurality of bit lines BL illustrated in FIG. 1. The plurality of bit lines 147 may be electrically connected with the plurality of active regions 118 through the plurality of direct contact conductive patterns 134, respectively. In some embodiments, the bit line structure 140 may further include a conductive semiconductor pattern 132 between the insulation layer patterns 112 and 114 and the bit line 147. The conductive semiconductor pattern 132 may include, e.g., doped polysilicon.

The bit line 147 may have a stack structure of a first metal-based conductive pattern 145 and a second metal-based conductive pattern 146 each having a line shape. In some embodiments, the first metal-based conductive pattern 145 may include TiN or Ti—Si—N (TSN), and the second metal-based conductive pattern 146 may include W or tungsten and tungsten silicide (WSix). In some embodiments, the first metal-based conductive pattern 145 may perform a function of a diffusion barrier. In some embodiments, the plurality of insulation capping lines 148 may include silicon nitride.

A plurality of insulation spacer structures 150 may cover both sidewalls of the plurality of bit line structures 140. Each of the plurality of insulation spacer structures 150 may include a first insulation spacer 152, a second insulation spacer 154, and a third insulation spacer 156. In some embodiments, the plurality of insulation spacer structures 150 may extend to inner portions of the plurality of direct contact holes 134H and may cover both sidewalls of the plurality of direct contact conductive patterns 134, respectively. The second insulation spacer 154 may include a material having a dielectric constant which is lower than that of each of the first insulation spacer 152 and the third insulation spacer 156. In some embodiments, the first insulation spacer 152 and the third insulation spacer 156 may include nitride, and the second insulation spacer 154 may include oxide. In some embodiments, the first insulation spacer 152 and the third insulation spacer 156 may include nitride, and the second insulation spacer 154 may include a material and an etch selectivity with respect to the first insulation spacer 152 and the third insulation spacer 156. In an implementation, the first insulation spacer 152 and the third insulation spacer 156 may include nitride, and the second insulation spacer 154 may be an air spacer. In some embodiments, the insulation spacer structure 150 may include the second insulation spacer 154 including oxide and the third insulation spacer 156 including nitride.

Each of a plurality of insulation fences may be in a space between a pair of insulation spacer structures 150 facing each other between a pair of bit line structures 140 adjacent to each other. The plurality of insulation fences 180 may be arranged apart from one another along a region between the pair of insulation spacer structures 150 (i.e., in the second horizontal direction (the Y direction) to configure a column. In an implementation, the plurality of insulation fences 180 may include nitride.

In some embodiments, the plurality of insulation fences 180 may be formed to pass through the insulation layer patterns 112 and 114 and extend to the inside of the dummy buried insulation layer 124. In some other embodiments, the plurality of insulation fences 180 may pass through the insulation layer patterns 112 and 114 but may not extend to the inside of the dummy buried insulation layer 124, may extend to the inside of the insulation layer patterns 112 and

114 but may not pass through the insulation layer patterns 112 and 114, or may be formed so that the plurality of insulation fences 180 do not extend to the inside of the insulation layer patterns 112 and 114 and lower surfaces of the plurality of insulation fences 180 contact the insulation layer patterns 112 and 114.

A plurality of buried contact holes 170H may be limited between the plurality of insulation fences 180, between two adjacent bit lines 147 of the plurality of bit lines 147. The plurality of buried contact holes 170H and the plurality of insulation fences 180 may be alternately arranged along a region (i.e., in the second horizontal direction (the Y direction) between a pair of insulation spacer structures 150 facing each other among the plurality of insulation spacer structures 150 covering both sidewalls of the plurality of bit line structures 140. Internal spaces of the plurality of buried contact holes 170H may be limited by the insulation spacer structure 150, the insulation fence 180, and the active region 118 each covering a sidewall of each of two adjacent bit lines 147, between two adjacent bit lines 147 of the plurality of bit lines 147. In some embodiments, each of the plurality of buried contact holes 170H may extend from the insulation spacer structure 150 and the insulation fence 180 to the inside of the active region 118.

The plurality of buried contacts 170 may be in the plurality of buried contact holes 170H. The plurality of buried contacts 170 may fill a portion of a lower portion of a space between the plurality of insulation spacer structures 150 covering both sidewalls of each of the plurality of insulation fences 180 and the plurality of bit line structures 140. The plurality of buried contact holes 170H and the plurality of insulation fences 180 may be alternately arranged along a region (i.e., in the second horizontal direction (the Y direction) between a pair of insulation spacer structures 150 facing each other among the plurality of insulation spacer structures 150 covering both sidewalls of the plurality of bit line structures 140. In an implementation, the plurality of buried contacts 170 may include polysilicon.

In some embodiments, the plurality of buried contacts 170 may be arranged in one row in each of the first horizontal direction (the X direction) and the second horizontal direction (the Y direction). Each of the plurality of buried contacts 170 may extend from the active region 118 in a vertical direction (a Z direction) perpendicular to the substrate 110. The plurality of buried contacts 170 may configure the plurality of buried contacts BC illustrated in FIG. 1.

A level of an upper surface of each of the plurality of buried contacts 170 may be lower than that of an upper surface of each of the plurality of insulation capping lines 148. Upper surfaces of the plurality of insulation fences 180 and the upper surfaces of the plurality of insulation capping lines 148 may be at the same vertical level in the vertical direction (the Z direction).

A plurality of landing pad holes 190H may be limited by the plurality of buried contacts 170, the plurality of insulation spacer structures 150, and the plurality of insulation fences 180. The plurality of buried contacts 170 may be exposed at lower surfaces of the plurality of landing pad holes 190H.

The plurality of landing pads 190 may fill at least partial portions of the plurality of landing pad holes 190H and may extend to the plurality of bit line structures 140. The plurality of landing pads 190 may be separated from one another by a recess portion 190R. Each of the plurality of landing pads 190 may include a conductive barrier layer and a conductive pad material layer on the conductive barrier layer. In an implementation, the conductive barrier layer may include metal, or conductive metal nitride. In some embodiments, the conductive barrier layer may be in a Ti/TiN stack structure. In some embodiments, the conductive pad material layer may include W. In some embodiments, a metal silicide layer may be formed between the landing pad 190 and the buried contact 170. The metal silicide layer may include cobalt silicide (CoSix), nickel silicide (NiSix), or manganese silicide (MnSix).

The plurality of landing pads 190 may be on the plurality of buried contacts 170 and may be electrically connected with the plurality of buried contacts 170 corresponding thereto. The plurality of landing pads 190 may be connected with the active region 118 through the plurality of buried contacts 170. The plurality of landing pads 190 may configure the plurality of landing pads LP illustrated in FIG. 1. The buried contact 170 may be between two adjacent bit line structures 140, and the landing pad 190 may extend toward one bit line structure 140 from a region between two adjacent bit line structures 140 with the buried contact 170 therebetween.

Figure 2A:
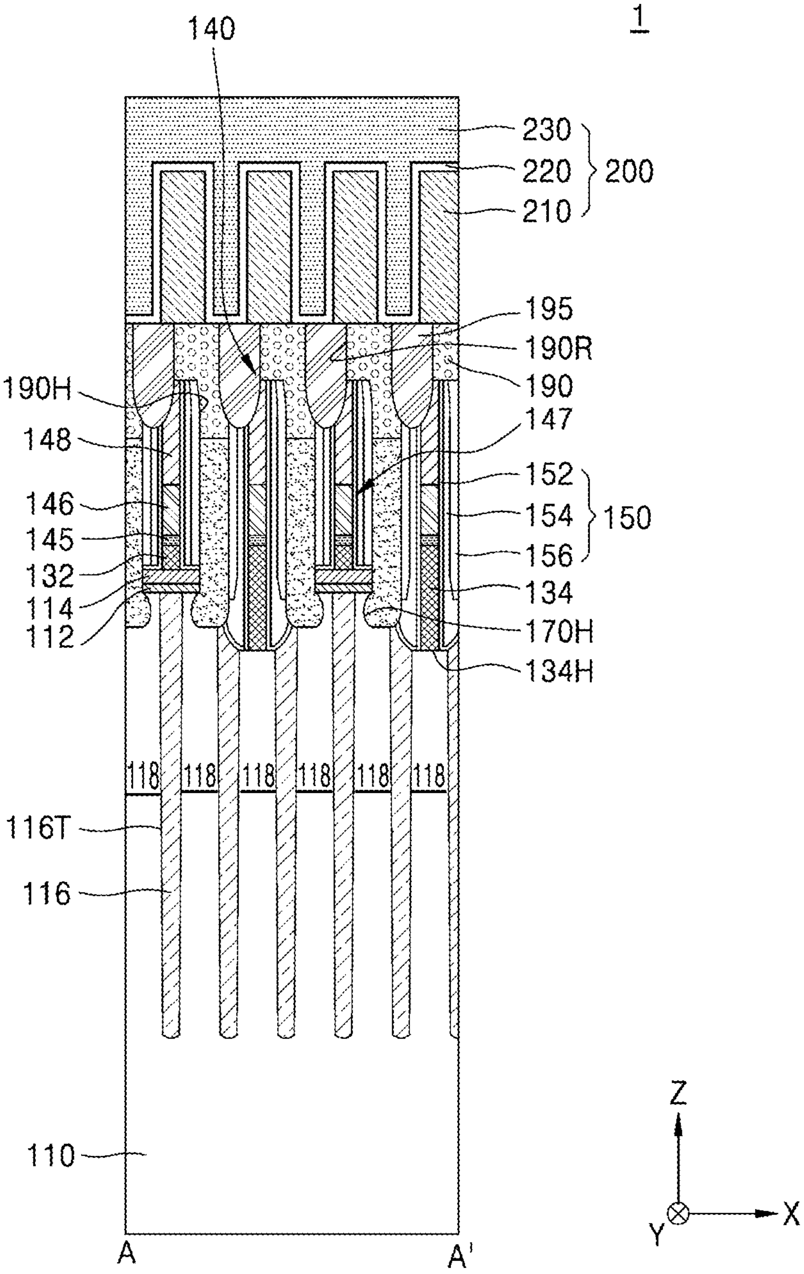
FIGS. 2A to 2D are cross-sectional views of a semiconductor device according to example embodiments.
Figure 2B:
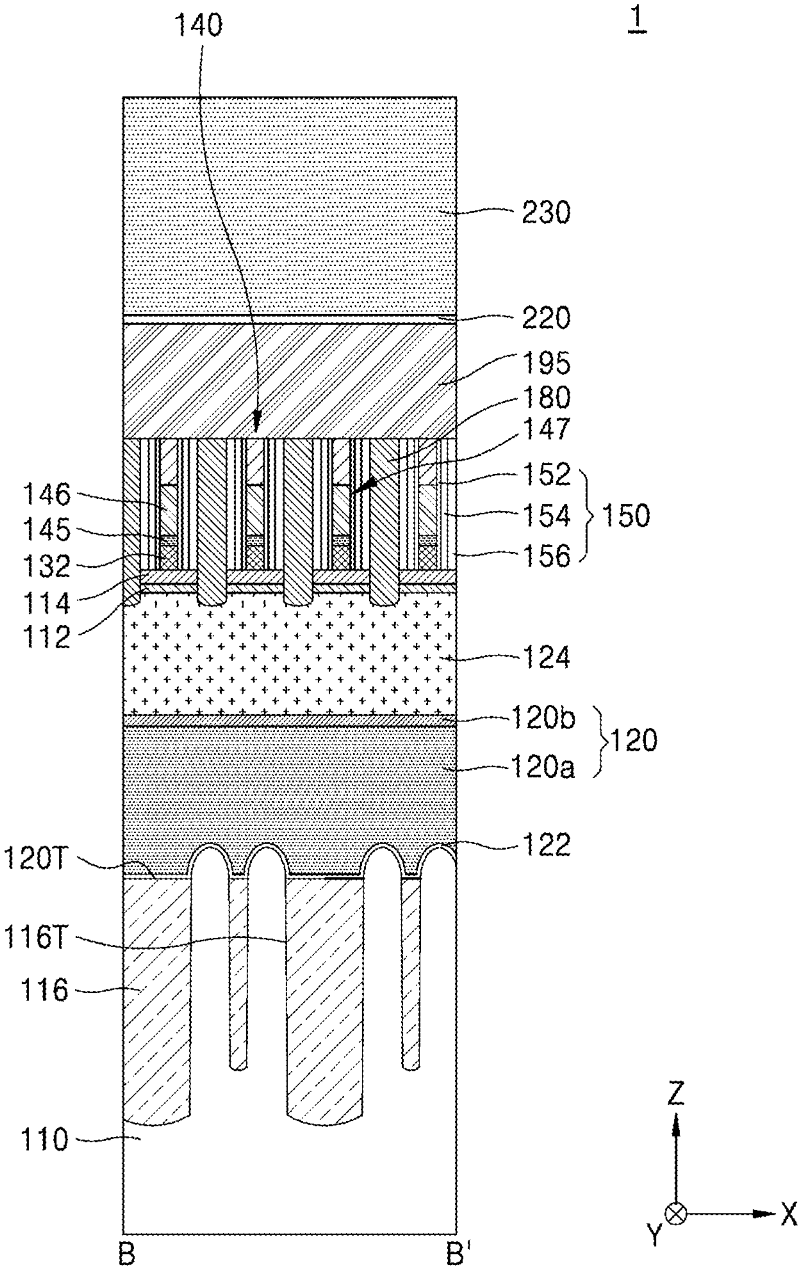
Figure 2C:
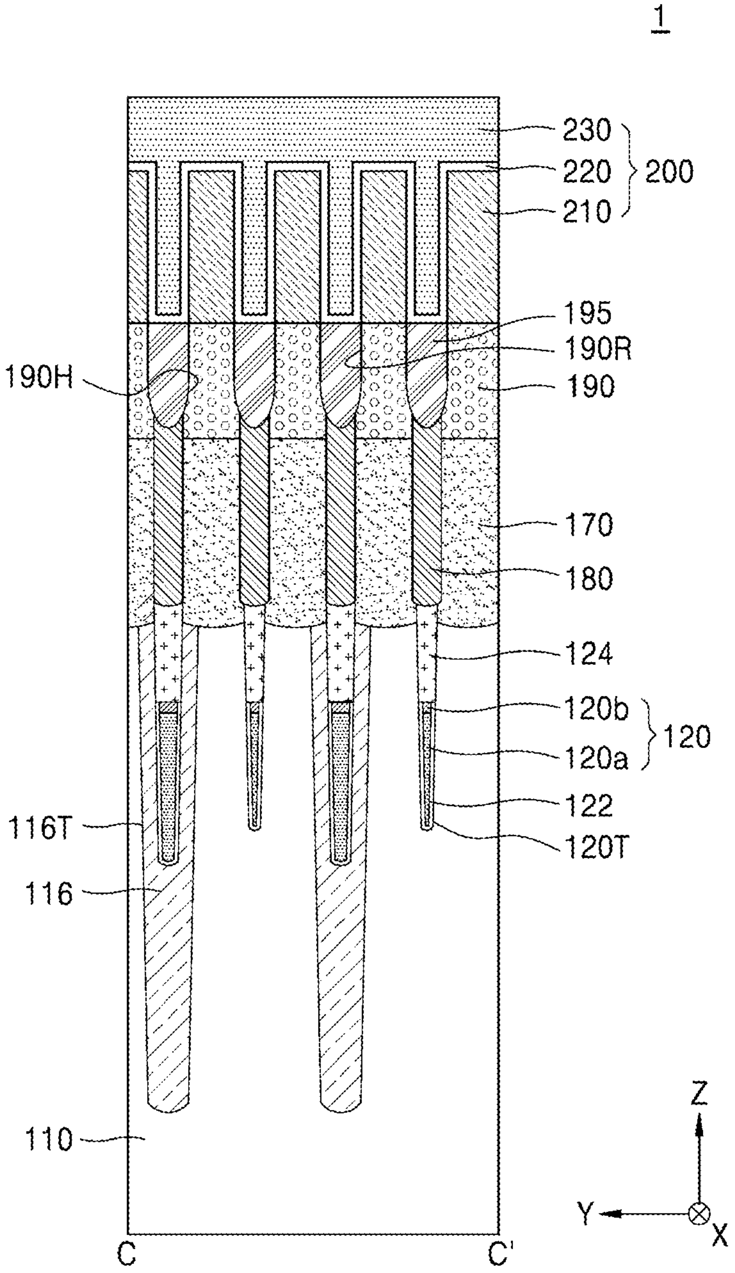
Figure 2D:
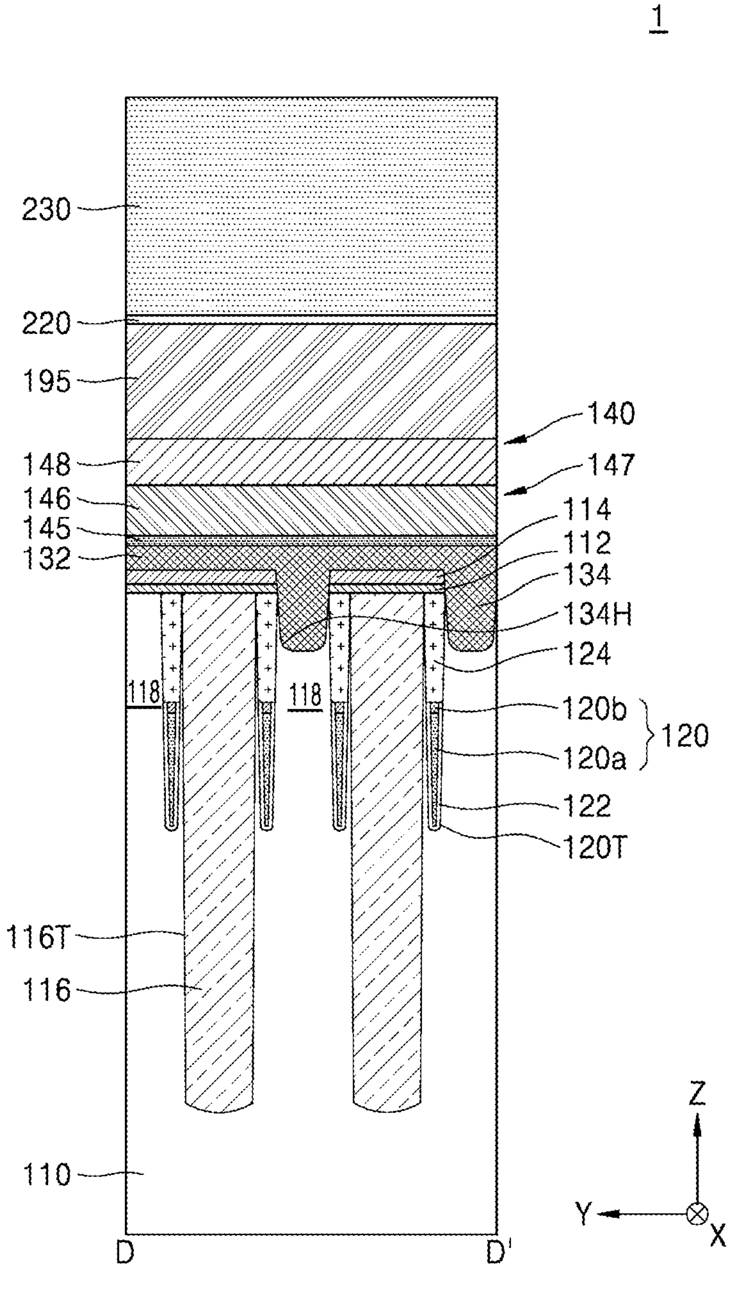

The recess portion 190R may be filled with the insulation structure 195. In some embodiments, the insulation structure 195 may include an interlayer insulation layer and an etch stop layer. In an implementation, the interlayer insulation layer may include oxide, and the etch stop layer may include nitride. In an implementation, the etch stop layer may include silicon nitride or silicon boron nitride (SiBN). In FIGS. 2A and 2C, it is illustrated that an upper surface of the insulation structure 195 and upper surfaces of the plurality of landing pads 190 may be arranged at the same vertical level. In an implementation, the insulation structure 195 may fill the recess portion 195R and may cover the upper surfaces of the plurality of landing pads 190, and thus, may include an upper surface at a vertical level which may be higher than the upper surfaces of the plurality of landing pads 190.

The plurality of capacitor structures 200 may include the plurality of lower electrodes 210, the capacitor dielectric layer 220, and the upper electrode 230 may be on the plurality of landing pads 190 and the insulation structure 195. The lower electrode 210 and the landing pad 190 corresponding to each other may be electrically connected with each other. In FIGS. 2A and 2C, an upper surface of the insulation structure 195 and a lower surface of the lower electrode 210 may be arranged at the same vertical level.

In some embodiments, the semiconductor device 1 may further include at least one supporting pattern which may contact sidewalls of the plurality of lower electrodes 210 and may support the plurality of lower electrodes 210. The at least one supporting pattern may include silicon nitride (SiN), silicon carbonitride (SiCN), N-rich silicon nitride (N-rich SiN), or Si-rich silicon nitride (Si-rich SiN). In some embodiments, the at least one supporting pattern may include a plurality of supporting patterns which may contact sidewalls of the plurality of lower electrodes 210 and may be arranged apart from one another at different vertical levels in the vertical direction (the Z direction).

Each of the plurality of lower electrodes 210 may have a pillar shape where an inner portion thereof is filled to include a horizontal cross-sectional surface having a circular shape. In some embodiments, each of the plurality of lower electrodes 210 may have a cylinder shape where a lower portion thereof may be closed. In some embodiments, the plurality of lower electrodes 210 may be arranged in a honeycomb shape where the plurality of lower electrodes 210 may be arranged in zigzag in the first horizontal direction (the X direction) or the second horizontal direction (the Y direction). In some other embodiments, the plurality of lower electrodes 210 may be arranged in a matrix form where the plurality of lower electrodes 210 may be arranged in one row in each of the first horizontal direction (the X direction) and the second horizontal direction (the Y direction). The plurality of lower electrodes 210 may include metal, such as impurity-doped silicon, tungsten, or copper, or a conductive metal compound such as TiN. In some other embodiments, the plurality of lower electrodes 210 may include TiN, CrN, VN, MoN, NbN, TiSiN, TiAlN, or TaAlN.

The capacitor dielectric layer 220 may conformally cover surfaces of the plurality of lower electrodes 210. In some embodiments, the capacitor dielectric layer 220 may be provided as one body to cover surfaces of the plurality of lower electrodes 210, in a certain region (e.g., one memory cell region (CR of FIG. 1)).

The capacitor dielectric layer 220 may include a material having an antiferroelectricity characteristic, a material having a ferroelectricity characteristic, or a material having the antiferroelectricity characteristic and the ferroelectricity characteristic. In an implementation, the capacitor dielectric layer 220 may include silicon oxide, or metal oxide. In some embodiments, the capacitor dielectric layer 220 may include a dielectric material $ABO_3$ or MOX. In an implementation, the capacitor dielectric layer 220 may include SiO, TaO, TaAlO, TaON, AlO, AlSiO, HfO, HfSiO, ZrO, RuO, WO, HfZrO, ZrSiO, TiO, TiAlO, VO, NbO, MoO, MnO, LaO YO, CoO, NiO, CuO, ZnO, FeO, SrO, BaO, BST((Ba,Sr) TiO), STO(SrTiO), BTO(BaTiO), PTO(PbTiO), AgNbO, BiFeO, PZT(Pb(Zr,Ti)O), (Pb,La)(Zr,Ti)O, or Ba(Zr,Ti)O, Sr(Zr,Ti)O.

The upper electrode 230 may be provided as one body on the plurality of lower electrodes 210, in a certain region (e.g., one memory cell region (CR of FIG. 1)). The plurality of lower electrodes 210, the capacitor dielectric layer 220, and the upper electrode 230 may configure the plurality of capacitor structures 200, in a certain region (e.g., one memory cell region (CR of FIG. 1)).

The upper electrode 230 may include metal, such as impurity-doped silicon, tungsten, or copper, or a conductive metal compound such as TiN. In some other embodiments, the upper electrode 230 may include TiN, CrN, VN, MoN, NbN, TiSiN, TiAlN, or TaAlN. In some other embodiments, the upper electrode 230 may have a stack structure of at least two of an impurity-doped semiconductor material layer, a main electrode layer, and an interface layer. The impurity-doped semiconductor material layer may include, e.g., doped polysilicon or doped poly polycrystalline silicon germanium (SiGe). The main electrode layer may include a metal material. The main electrode layer may include, e.g., W, Ru, RuO, Pt, PtO, Ir, IrO, SRO(SrRuO), BSRO((Ba,Sr) RuO), CRO(CaRuO), BaRuO, or La(Sr,Co)O. In some embodiments, the main electrode layer may include W. The interface layer may include metal oxide, metal nitride, metal carbide, or metal silicide.

Figure 3A:
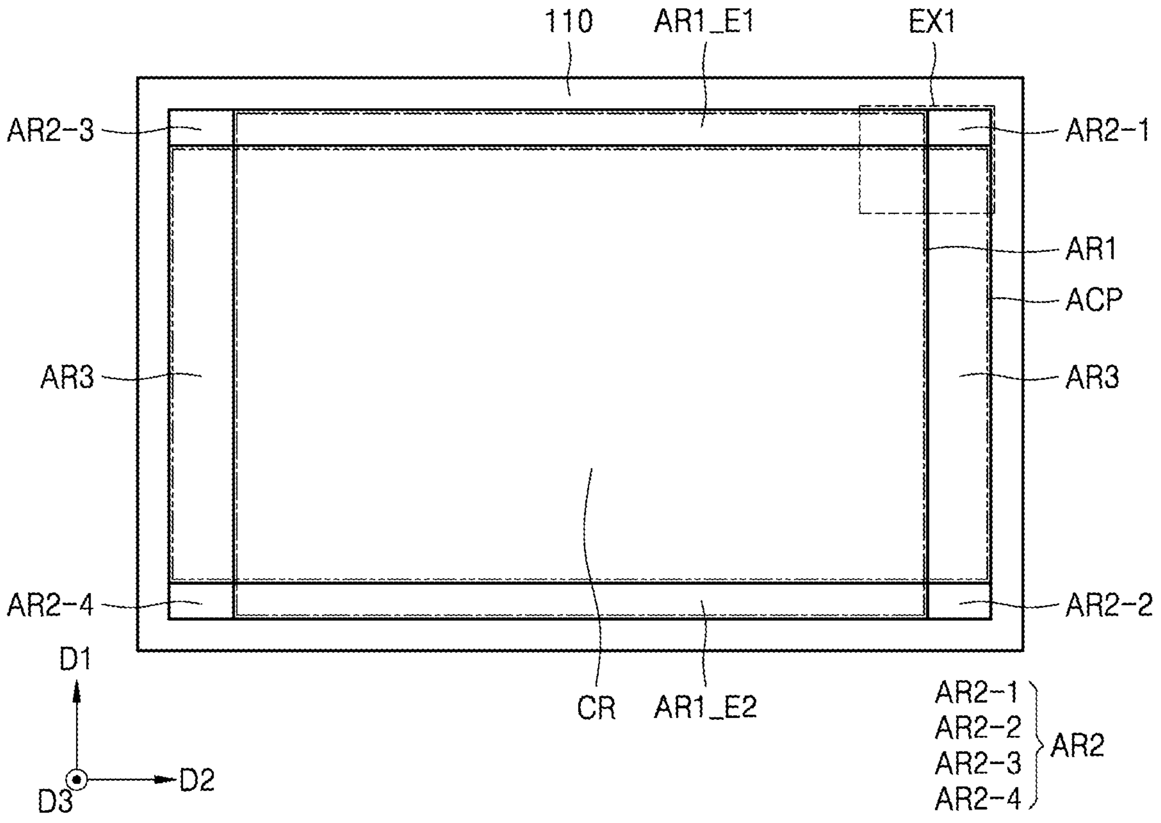
FIG. 3A is a layout diagram of a partial area of a semiconductor device according to example embodiments.
Figure 3B:
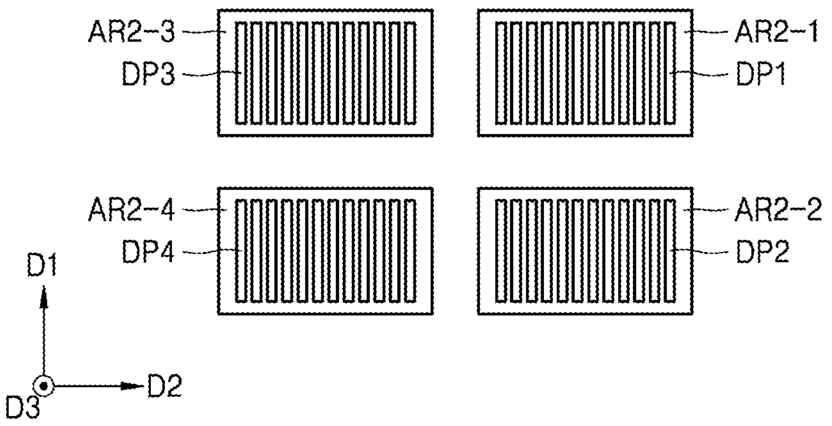
FIG. 3B is a schematic plan view of a partial area of a semiconductor device according to example embodiments.

FIG. 3A is a layout diagram illustrating a partial area of a semiconductor device according to example embodiments. FIG. 3B is a plan view schematically illustrating a partial area of a semiconductor device according to example embodiments. A first direction D1, a second direction D2, and a third direction D3 of FIGS. 3A and 3B may respectively correspond to the first horizontal direction (the X direction), the second horizontal direction (the Y direction), and the vertical direction (the Z direction) of FIGS. 1 and 2A to 2D.

Referring to FIG. 3A, a first area AR1, a second area AR2, and a third area AR3 may be provided in a substrate 110. An edge of the first area AR1 may be illustrated by a dash-single dotted line. Each of the second area AR2 and the third area AR3 may be arranged adjacent to the first area AR1 in the second direction D2. The second area AR2 and the third area AR3 may be arranged adjacent to each other in the first direction D1.

In some embodiments, the first area AR1 may be an area where the word line WL described above with reference to FIG. 1 and the word line 120 described above with reference to FIGS. 2A to 2D may be patterned. In some embodiments, the second area AR2 may be an area where a dummy pattern (DP1, DP2, DP3, and DP4 of FIG. 3B) described below with reference to FIGS. 3B and 4 (i.e., a dummy word line (320 of FIG. 4)) may be patterned.

In some embodiments, the second area AR2 may include a first sub-area AR2-1, a second sub-area AR2-2, a third sub-area AR2-3, and a fourth sub-area AR2-4. Each of the first sub-area AR2-1, the second sub-area AR2-2, the third sub-area AR2-3, and the fourth sub-area AR2-4 may be arranged adjacent to the first area AR1 in the second direction D2. Each of the first sub-area AR2-1, the second sub-area AR2-2, the third sub-area AR2-3, and the fourth sub-area AR2-4 may be arranged adjacent to an end portion, in the first direction D1, of the first area AR1 in the second direction D2. In an implementation, the first sub-area AR2-1 may be arranged adjacent to a first end portion AR1_E1, in the first direction D1, of the first area AR1 in the second direction D2. In an implementation, the second sub-area AR2-2 may be arranged adjacent to a second end portion AR1_E2, which is in the first direction D1 and is opposite to the first end portion AR1_E1, of the first area AR1 in the second direction D2. In an implementation, the third sub-area AR2-3 may be arranged adjacent to the first end portion AR1_E1 of the first area AR1 in the second direction D2. In an implementation, the fourth sub-area AR2-4 may be arranged adjacent to the second end portion AR1_E2 of the first area AR1 in the second direction D2.

In some embodiments, a length of the first end portion AR1_E1 of the first area AR1 in the first direction D1 may be equal to that of each of the first sub-area AR2-1 and the third sub-area AR2-3 in the first direction D1. In some embodiments, a length of the second end portion AR1_E2 of the first area AR1 in the first direction D1 may be equal to that of each of the second sub-area AR2-2 and the fourth sub-area AR2-4 in the first direction D1. In some embodiments, a length of the first end portion AR1_E1 of the first area AR1 in the first direction D1 may be equal to that of the second end portion AR1_E2 of the first area AR1 in the first direction D1. In other embodiments, a length of the first end portion AR1_E1 of the first area AR1 in the first direction D1 may differ from that of the second end portion AR1_E2 of the first area AR1 in the first direction D1.

The first sub-area AR2-1, the second sub-area AR2-2, the third sub-area AR2-3, and the fourth sub-area AR2-4 may be arranged apart from one another. In some embodiments, the first sub-area AR2-1, the second sub-area AR2-2, the third sub-area AR2-3, and the fourth sub-area AR2-4 may be arranged apart from one another in the first direction D1 and/or the second direction D2 with the first area AR1 and/or the third area AR3 therebetween. The first sub-area AR2-1 and the second sub-area AR2-2 may be arranged apart from each other in the first direction D1 with the third area AR3 therebetween. In an implementation, the first sub-area AR2-1 and the second sub-area AR2-2 may be arranged in the same direction with respect to the first area AR1. The first sub-area AR2-1 and the third sub-area AR2-3 may be arranged apart from each other in the second direction D2 with the first area AR1 therebetween. The first sub-area AR2-1 and the fourth sub-area AR2-4 may be arranged apart from each other in the first direction D1 and the second direction D2 with the first area AR1 and the third area AR3 therebetween.

In some embodiments, a length of each of the first sub-area AR2-1, the second sub-area AR2-2, the third sub-area AR2-3, and the fourth sub-area AR2-4 in the first direction D1 may be less than that of the first area AR1 in the first direction D1.

In some embodiments, the second area AR2 may not overlap the first area AR1. Each of the first sub-area AR2-1, the second sub-area AR2-2, the third sub-area AR2-3, and the fourth sub-area AR2-4 may not overlap the first area AR1.

In some embodiments, the second area AR2 may not overlap the third area AR3. Each of the first sub-area AR2-1, the second sub-area AR2-2, the third sub-area AR2-3, and the fourth sub-area AR2-4 may not overlap the third area AR3 adjacent thereto.

Referring again to FIG. 3, an active region patterning area ACP may be provided in the substrate 110. An edge of the active region patterning area ACP may be illustrated by a dash-single dotted line. The active region patterning area ACP may be an area where the active region ACT described above with reference to FIG. 1 and the active region 118 described above with reference to FIGS. 2A to 2D are patterned. In an implementation, the active region ACT (see FIG. 1) and the active region 118 (see FIGS. 2A to 2D) may be provided in the active region patterning area ACP. The active regions ACT and 118 may not be provided outside the active region patterning area ACP. The active regions ACT and 118 patterned in the active region patterning area ACP may include a dummy active region 418 provided in the third area AR3.

In some embodiments, the active region patterning area ACP may overlap a portion of the first area AR1 in terms of a plane. In some embodiments, a length of the active region patterning area ACP in the second direction D2 may be greater than that of the first area AR1 in the second direction D2. In some embodiments, a length of the active region patterning area ACP in the first direction D1 may be less than that of the first area AR1 in the first direction D1. The active region patterning area ACP may include an area which does not overlap the first area AR1. The first area AR1 may include an area which does not overlap the active region patterning area ACP. An area, where the active region patterning area ACP does not overlap the first area AR1, may be the third area AR3 described above. The third area AR3 may be an area where the dummy active region 418 described above is patterned. In an implementation, the active region patterning area ACP may include the third area AR3 which does not overlap the first area AR1 and is adjacent to the first area AR1 in the second direction D2. In an implementation, the first area AR1 may include an area where the active regions ACT and 118 are not provided.

In some embodiments, an area where the first area AR1 overlaps the active region patterning area ACP may be the memory cell region CR described above with reference to FIG. 1.

Referring to FIG. 3B, a first dummy pattern DP1, a second dummy pattern DP2, a third dummy pattern DP3, and a fourth dummy pattern DP4 may be respectively provided in the first sub-area AR2-1, the second sub-area AR2-2, the third sub-area AR2-3, and the fourth sub-area AR2-4.

In some embodiments, each of the first dummy pattern DP1, a second dummy pattern DP2, a third dummy pattern DP3, and a fourth dummy pattern DP4 may include a plurality of dummy word lines 320 described below with reference to FIG. 4. In an implementation, each of the first dummy pattern DP1, a second dummy pattern DP2, a third dummy pattern DP3, and a fourth dummy pattern DP4 may include a plurality of dummy word lines 320 which may extend in parallel in the first direction D1 and may be apart from one another in the second direction D2.

In a case where the first dummy pattern DP1, the second dummy pattern DP2, the third dummy pattern DP3, and the fourth dummy pattern DP4 are not provided in the first sub-area AR2-1, the second sub-area AR2-2, the third sub-area AR2-3, and the fourth sub-area AR2-4, a length of the word line 120 in the first direction D1 may be formed not to be constant. In example embodiments, in a case where the first to fourth dummy patterns DP1 to DP4 are formed adjacent to the first area AR1, the first to fourth dummy patterns DP1 to DP4 may be at an outermost portion, and thus, a length of the word line 120 in the first direction D1 may be constant.

Figure 4:
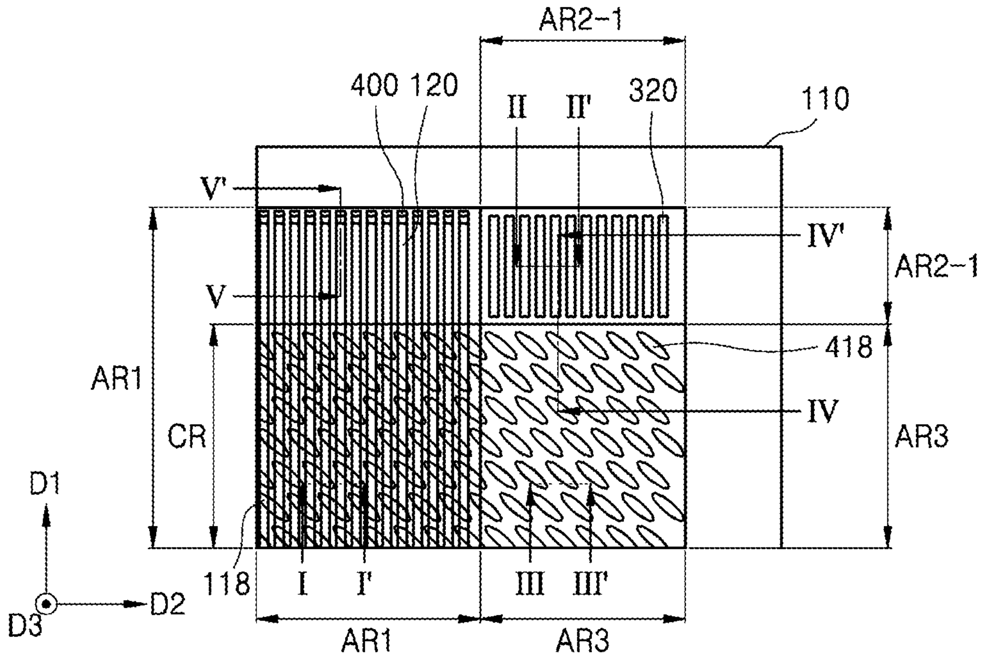
FIG. 4 is an enlarged plan view of a region EX1 of FIG. 3A, showing elements of a semiconductor device according to example embodiments.

FIG. 4 is an enlarged plan view of a region EX1 of FIG. 3A, for describing some elements of a semiconductor device according to example embodiments. FIGS. 5A to 5E are cross-sectional views taken along line I-I', line line line IV-IV', and line V-V' of FIG. 4, for describing some elements of a semiconductor device according to example embodiments. FIGS. 6A and 6B are plan views for describing some elements of a semiconductor device according to example embodiments.

Referring to FIG. 4, a word line 120, an active region 118, a dummy word line 320, a dummy active region 418, and a word line contact 400 may be in a substrate 110. The word line 120, the active region 118, and the word line contact 400 may be in a first area AR1, the dummy word line 320 may be in a first sub-area AR2-1, and the dummy active region 418 may be in the third area AR3.

Figure 5A:
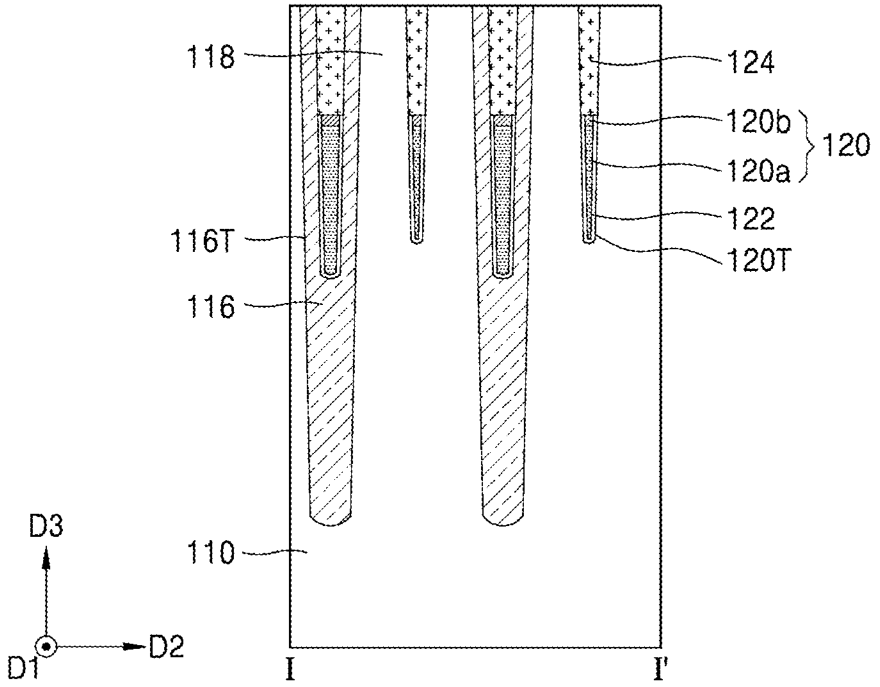
FIGS. 5A to 5E are cross-sectional views taken along line I-I', line line III-III', line IV-IV', and line V-V' of FIG. 4, showing elements of a semiconductor device according to example embodiments.
Figure 6A:
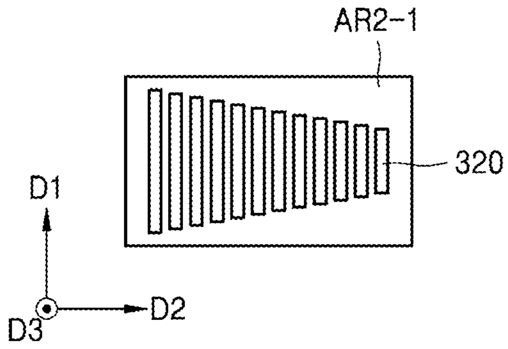
FIGS. 6A and 6B are plan views showing elements of a semiconductor device according to example embodiments.
Figure 6B:
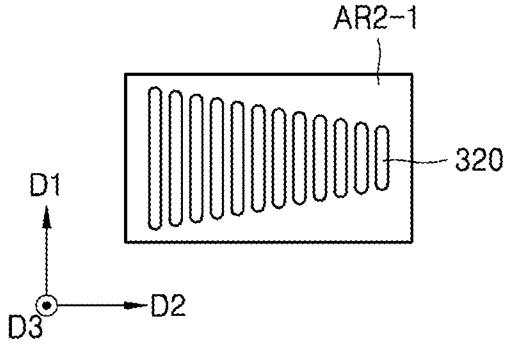

Referring to FIGS. 4 and 5A, the active region 118 defined as an isolation layer 116 may be in the substrate 110, and the word line 120 which may extend in a first direction D1 and may be apart from an adjacent word line 120 in a second direction D2 may be in the isolation layer 116 and the active region 118. A detailed description of the word line 120 may be as described above with reference to FIGS. 2A to 2D.

Figure 5B:
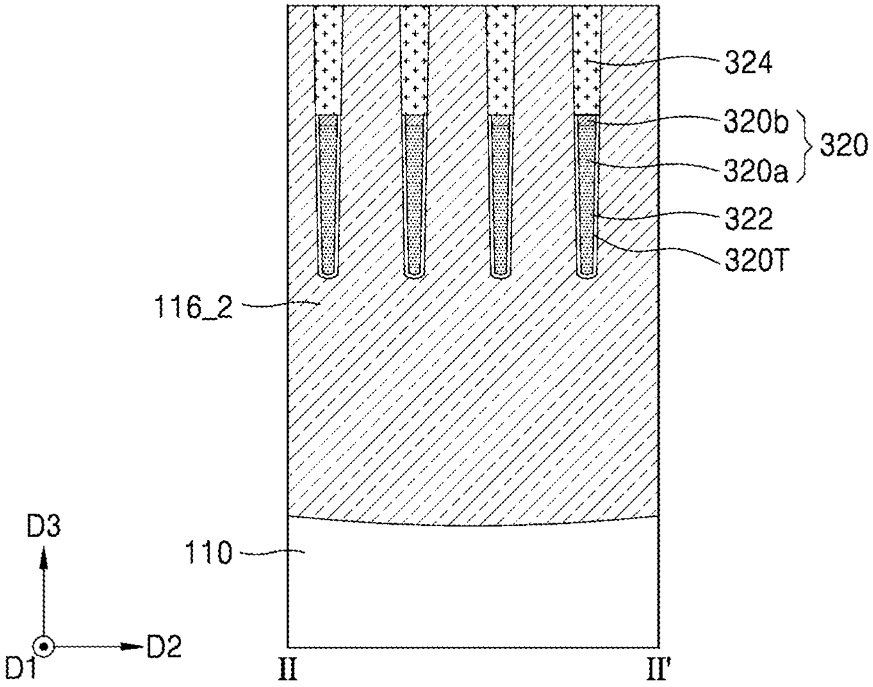

Referring to FIGS. 4 and 5B, an isolation layer 116_2 may be in a substrate 110, and a dummy word line 320 which may extend in a first direction D1 and may be apart from an adjacent dummy word line 320 in a second direction D2 may be in the isolation layer 116_2. The isolation layer 116_2 may include a portion, in a second area AR2, of the isolation layer 116. The isolation layer 116_2 may include silicon oxide and/or silicon nitride.

In some embodiments, the isolation layer 116_2 in the first sub-area AR2-1 may include the same material as that of the isolation layer 116 in the first area AR1 (particularly, a memory cell area CR). The isolation layer 116_2 in the first sub-area AR2-1 may be formed through the same process as the isolation layer 116 in the first area AR1. As described above, an active region may not be patterned in the first sub-area AR2-1, and unlike the isolation layer 116 in the memory cell area CR which may define the active region 118, the isolation layer 116_2 in the first sub-area AR2-1 may not define an active region. Therefore, unlike that the word line 120 is in the isolation layer 116 and the active region 118 in the memory cell region CR, the dummy word line 320 may be in only the isolation layer 116_2 in the first sub-area AR2-1.

In some embodiments, a plurality of dummy word line trenches 320T may be in the isolation layer 116_2. The plurality of dummy word line trenches 320T may extend in parallel in the first direction D1 and may have a line shape which is arranged to have substantially an equal interval in the second direction D2. The dummy word line trench 320T of the first sub-area AR2-1 may be formed through the same process as a word line trench 120T of the first area AR1.

A plurality of dummy gate dielectric layers 322, a plurality of dummy word lines 320, and a plurality of dummy buried insulation layers 324 may be sequentially formed in the plurality of dummy word line trenches 320T. The plurality of dummy word lines 320 may extend in parallel in the first direction D1 and may have a line shape which may be arranged to have substantially an equal interval in the second direction D2.

The plurality of dummy word lines 320 may fill lower partial portions of the plurality of dummy word line trenches 320T. Each of the plurality of dummy word lines 320 may have a stack structure of a lower dummy word line layer 320*a* and an upper dummy word line layer 320*b*. In some embodiments, the lower dummy word line layer 320*a* and the upper dummy word line layer 320*b* may be formed through the same process as the lower word line layer 120*a* and the upper word line layer 120*b* of the first area AR1 described above with reference to FIGS. 2A to 2D. In an implementation, the lower dummy word line layer 320*a* may conformally cover an inner sidewall and a lower surface of a portion of a lower portion of the dummy word line trench 320T with the dummy gate dielectric layer 322 therebetween. In an implementation, the upper dummy word line layer 320*b* may cover the lower dummy word line layer 320*a* and may fill a portion of a lower portion of the dummy word line trench 320T with the dummy gate dielectric layer 322 therebetween. In some embodiments, the lower dummy word line layer 320*a* and the upper dummy word line layer 320*b* may include the same material as that of the lower word line layer 120*a* and the upper word line layer 120*b* of the first area AR1 described above with reference to FIGS. 2A to 2D. In an implementation, the lower dummy word line layer 320*a* may include conductive metal nitride or a metal material such as Ti, TiN, Ta, or TaN. In an implementation, the upper dummy word line layer 320*b* may include, e.g., doped polysilicon, a metal material such as W, conductive metal nitride such as WN, TiSiN, or WSiN.

The dummy gate dielectric layer 322 may cover the inner sidewall and the lower surface of the dummy word line trench 320T. The dummy gate dielectric layer 322 may be formed through the same process as the gate dielectric layer 122 of the first area AR1 described above with reference to FIGS. 2A to 2D. In some embodiments, the dummy gate dielectric layer 322 may extend up to a region between the buried insulation layer 324 and the dummy word line trench 320T from a region between the dummy word line 320 and the dummy word line trench 320T. The dummy gate dielectric layer 322 may include the same material as that of the gate dielectric layer 122 of the first area AR1 described above with reference to FIGS. 2A to 2D. In an implementation, the dummy gate dielectric layer 322 may include silicon oxide, silicon nitride, silicon oxynitride, ONO, or a high-k dielectric material having a dielectric constant which is greater than that of the silicon oxide. In an implementation, the dummy gate dielectric layer 322 may include hafnium oxide (HfO), hafnium silicate (HfSiO), hafnium oxide nitride (HfON), hafnium silicon oxide nitride (HfSiON), lanthanum oxide (LaO), lanthanum aluminum oxide (LaAlO), zirconium oxide (ZrO), zirconium silicon oxide (ZrSiO), zirconium oxide nitride (ZrON), zirconium silicon oxide nitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), or lead scandium tantalum oxide (PbScTaO). In an implementation, the gate dielectric layer 122 may include $HfO_2$, $Al_2O_3$, $HfAlO_3$, $Ta_2O_3$, or $TiO_2$.

Each of the plurality of dummy buried insulation layers 324 may fill a portion of an upper portion of a corresponding word line trench 120T of the plurality of dummy word line trenches 320T. The plurality of dummy buried insulation layers 324 may be formed through the same process as the plurality of buried insulation layers 124 of the first area AR1 described above with reference to FIGS. 2A to 2D. The plurality of dummy buried insulation layers 324 may include the same material as that of the plurality of buried insulation layers 124 of the first area AR1 described above with reference to FIGS. 2A to 2D. The dummy buried insulation layer 324 may include silicon oxide, silicon nitride, or silicon oxynitride. In an implementation, the dummy buried insulation layer 324 may include silicon nitride.

In some embodiments, five to twenty dummy word lines 320 may be in the first sub-area AR2-1. The number of dummy word lines in the first sub-area AR2-1 may be merely an embodiment and may be modified depending on the case.

Figure 5C:
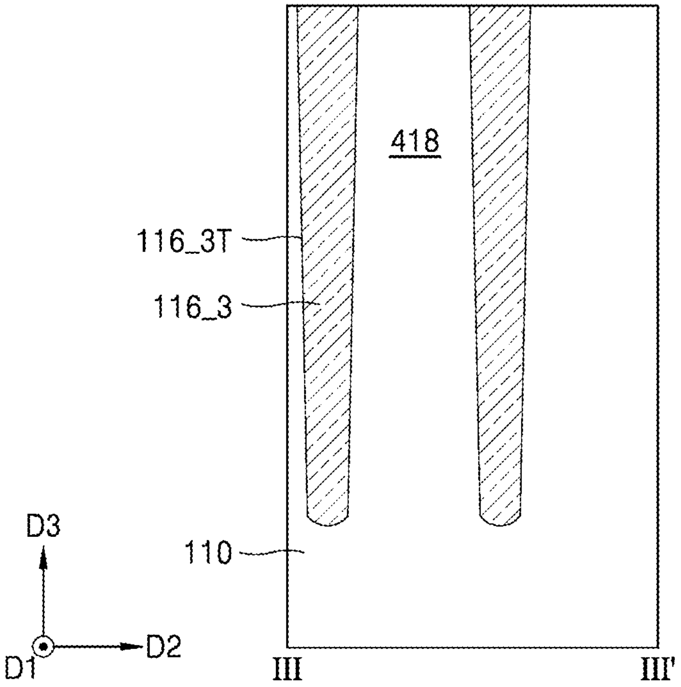

Referring to FIGS. 4 and 5C, an isolation layer 116_3 and an active region 418 defined as the isolation layer 116_3 may be in a substrate 110. The isolation layer 116_3 may include a portion, in the third area AR3, of the isolation layer 116.

In some embodiments, the isolation layer 116_3 in the third area AR3 may include the same material as that of the isolation layer 116 in the first area AR1 (particularly, the memory cell area CR). The isolation layer 116_3 in the third area AR3 may be formed through the same process as the isolation layer 116 in the first area AR1. The isolation layer 116_3 may include silicon oxide or silicon nitride.

Because the word line 120 may not be in the third area AR3 as described above, unlike the word line 120 which may be in the isolation layer 116 and the active region 118 which may be in the memory cell area CR, the word line 120 may not be in the isolation layer 116_3 and the active region 418 may not be in the third area AR3.

Figure 5D:
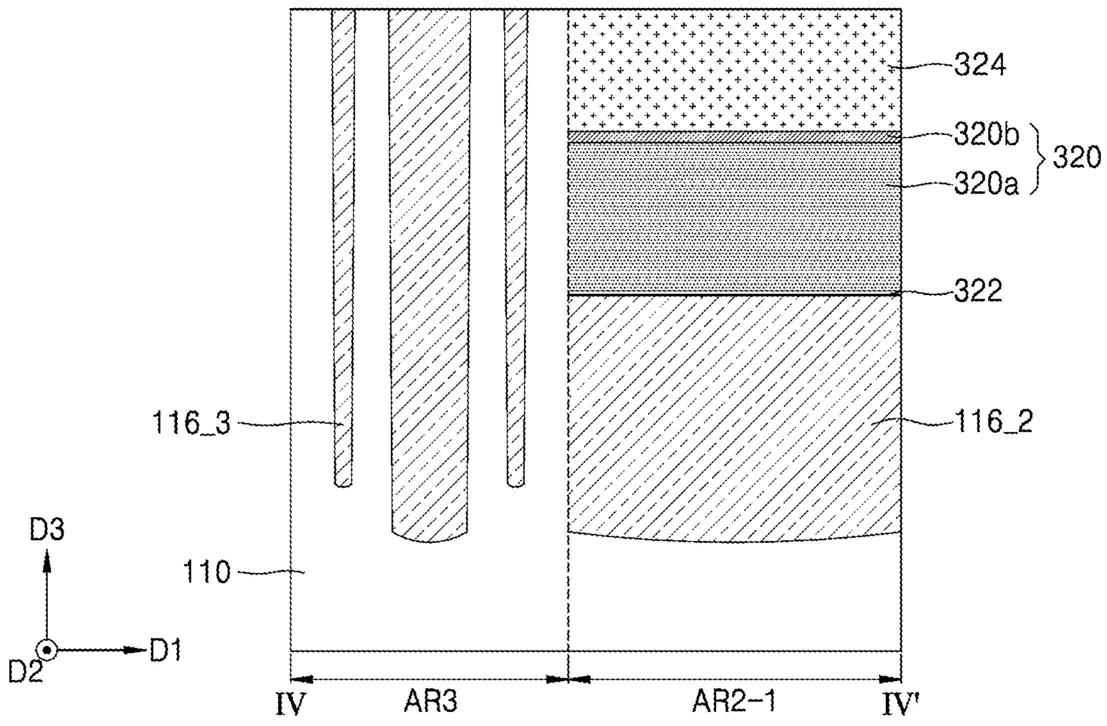

Referring to FIGS. 4 and 5D, an isolation layer 116_3 may be in a third area AR3 of a substrate 110, and an isolation layer 116_2 may be in a first sub-area AR2-1 adjacent to the third area AR3.

In some embodiments, a dummy word line 320 extending in a first direction D1 may be on the isolation layer 116_2 of the first sub-area AR2-1. A dummy gate dielectric layer 322, a dummy word line 320, and a dummy buried insulation layer 324 may be sequentially formed on the isolation layer 116_2.

In some embodiments, the dummy word line 320 in the first sub-area AR2-1 may not extend to an adjacent third area AR3.

Figure 5E:
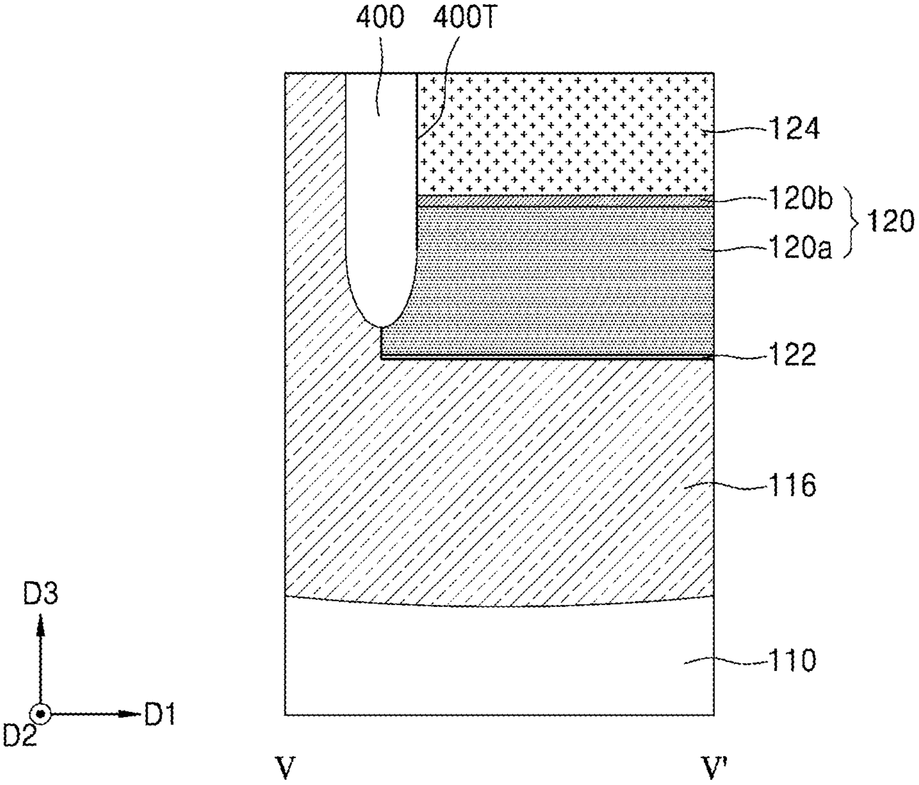

Referring to FIGS. 4 and 5E, an isolation layer 116 may be in a substrate 110, a word line 120 extending in a first direction D1 may be in the isolation layer 116, and a word line contact trench 400T may be formed by etching an end portion of the word line 120 and the isolation layer 116. A word line contact 400 may be in the word line contact trench 400T and may be electrically connected with the word line 120. In an implementation, the word line contact 400 may be at the end portion of the word line 120 in a first area AR1. The word line contact 400 may be in a region where the active region 118 may not be patterned. In some embodiments, the word line contact 400 may not be in a first sub-area AR2-1. The word line contact 400 may not be at an end portion of the dummy word line 320.

In some embodiments, a portion of the word line contact 400 may overlap the word line 120. In some embodiments, a portion of the word line contact 400 may overlap the isolation layer 116. In some embodiments, at least a portion of the word line contact 400 may not overlap the word line 120. The word line contact 400 may not overlap the dummy word line 320.

As described above, because the word line contact trench 400T where the word line contact 400 is provided may be formed by etching the word line 120 and a portion of the isolation layer 116 in the first area AR1, a length of the word line 120 in the first direction D1 in the first area AR1 may be maintained to be constant. In a case where a length of the word line 120 in the first direction D1 in the first area AR1 is not maintained to be constant, a ratio of the isolation layer 116 and the word line 120 each etched for forming the word line contact trench 400T may vary. Therefore, the word line contact trench 400T may be formed to have a non-constant depth, causing a defect of the word line contact 400.

Referring to FIGS. 3A and 4, in the semiconductor device according to embodiments, the dummy word line 320 may be in a region (i.e., the second area AR2) outside the first area AR1 where the word line 120 may be formed and the active region patterning area ACP where the active region 118 may be patterned, and thus, a length of the word line 120 in the first direction D1 may be maintained to be constant. In an implementation, in the semiconductor device including the dummy word line 320 according to an example embodiment, a defect where the word line contact 400 may be formed not to be constant may be improved.

Referring to FIGS. 4 and 6A, a plurality of dummy word lines 320 in a first sub-area AR2-1 may progressively decrease in length in the first direction D1. A length of each of the plurality of dummy word lines 320 in the first direction D1 may decrease in a direction distancing from the first area AR1.

Referring to FIGS. 4 and 6B, a plurality of dummy word lines 320 in a first sub-area AR2-1 may have a round corner and may extend in the first direction D1.

In FIGS. 6A and 6B, the plurality of dummy word lines 320 in the first sub-area AR2-1 may be illustrated, and this may be like a plurality of dummy word lines 320 in second to fourth sub-areas AR2-2 to AR2-4.

Figure 7:
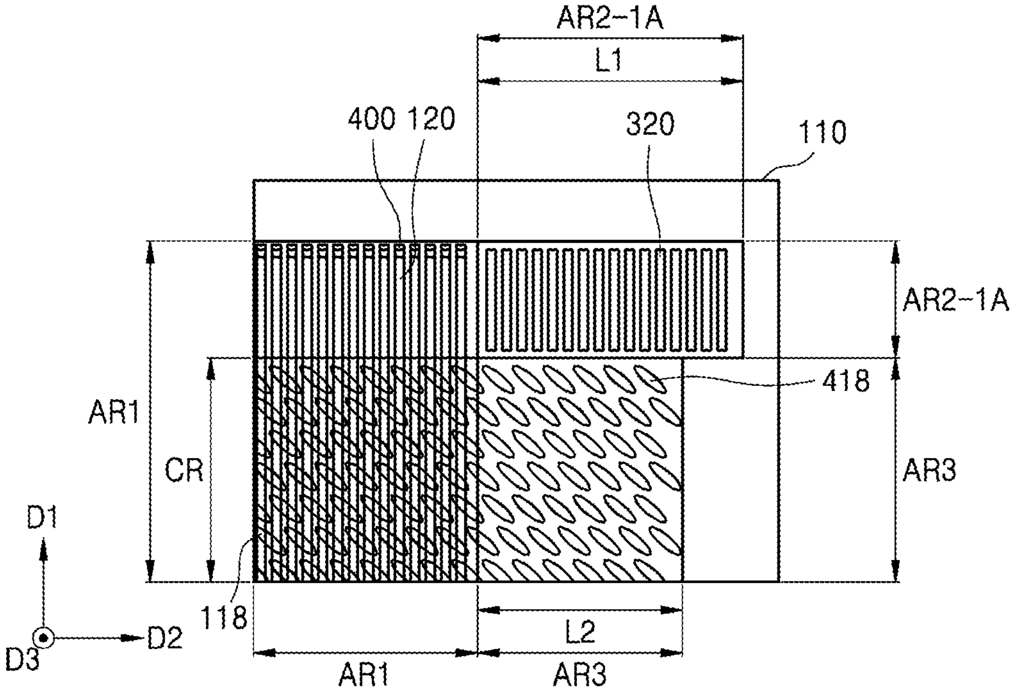
FIG. 7 is an enlarged plan view of a region EX1 of FIG. 3A showing elements of a semiconductor device according to example embodiments.

FIG. 7 is an enlarged plan view of a region EX1 of FIG. 3A, for describing some elements of a semiconductor device according to other embodiments.

Referring to FIG. 7, a length L1 of a first sub-area AR2-1A in a second direction D2 may be greater than a length L2 of an adjacent third area AR3 in the second direction D2. The length L1 of the first sub-area AR2-1A in the second direction D2 may be determined based on the number of dummy word lines 320 in the first sub-area AR2-1A. In an implementation, the dummy word line 320 may be in an area which does not overlap the adjacent third area AR3 in the first direction D1.

FIGS. 8A to 17B are plan views and cross-sectional views for describing a method of manufacturing a semiconductor device, according to example embodiments. FIGS. 8A, 9A, 10A, 11A, 12A, 13A, 14A, 15A, 16A, and 17A are enlarged plan views of a region corresponding to a region EX1, and FIGS. 8B, 9B, 10B, 11B, 12B, 13B, 14B, 15B, 16B, and 17B are cross-sectional views taken along lines I-I' and lines II-IF of FIGS. 8A, 9A, 10A, 11A, 12A, 13A, 14A, 15A, 16A, and 17A.

Figure 8A:
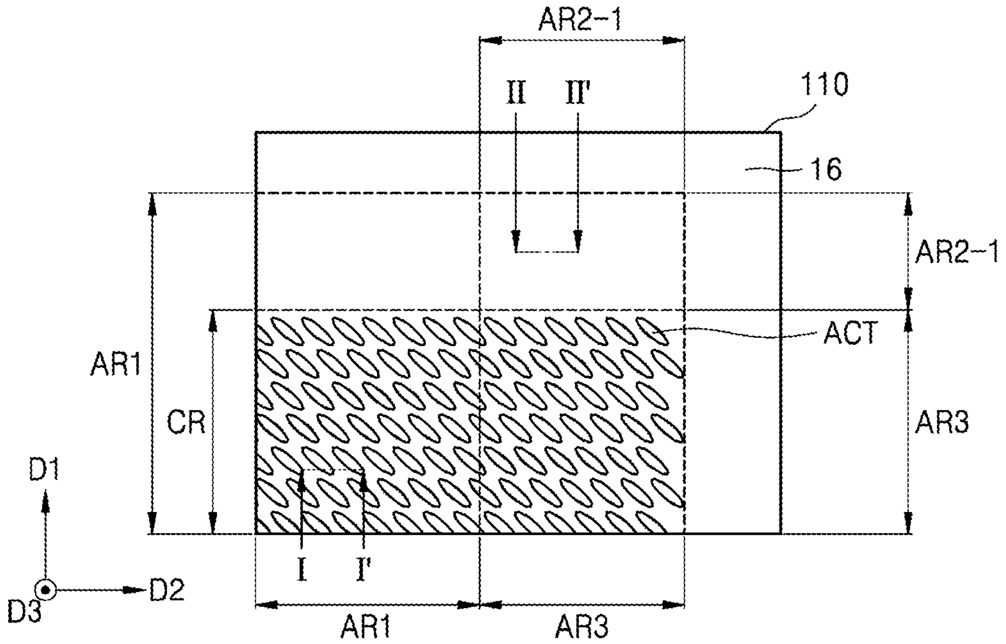
FIGS. 8A to 17B are plan views and cross-sectional views showing a method of manufacturing a semiconductor device according to example embodiments.
Figure 8B:
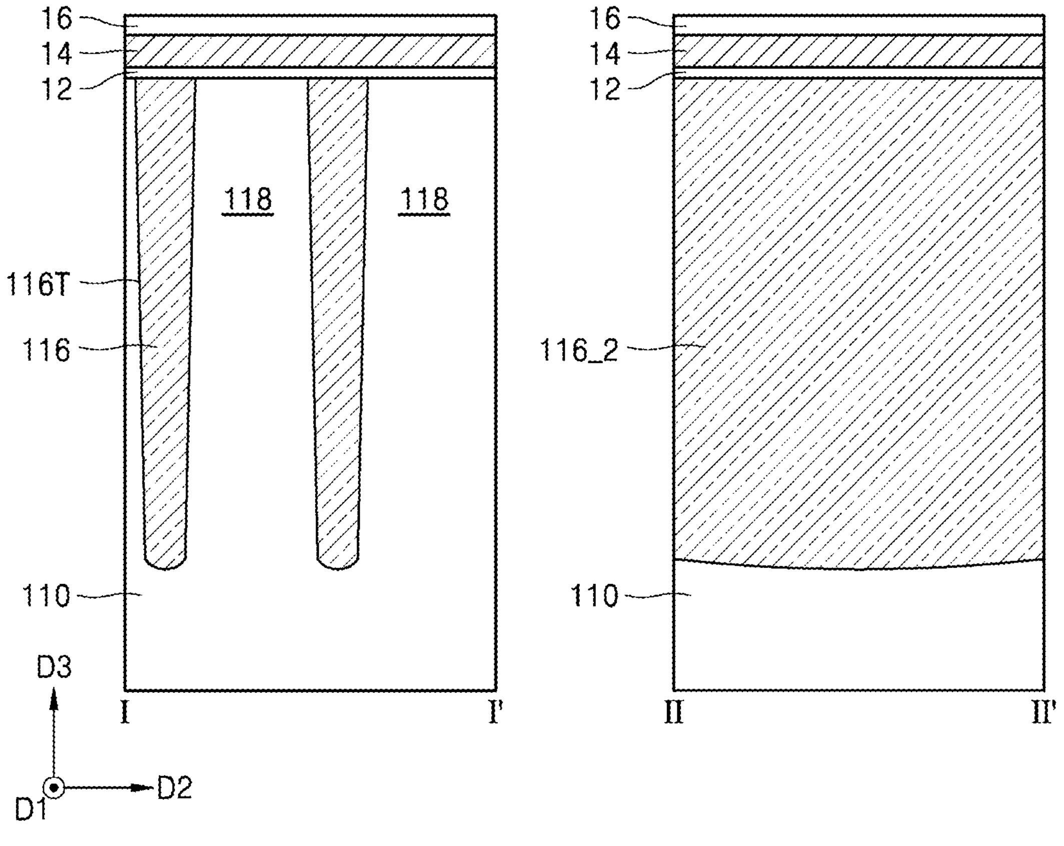

Referring to FIGS. 8A and 8B, a first buffer layer 12, a second buffer layer 14, and a third buffer layer 16 may be sequentially formed on a substrate 110 in a first area AR1 and a first sub-area AR2-1. The first buffer layer 12 may include an oxide film. In an implementation, the first buffer layer 12 may include oxide film of a thermal oxide film, an undoped silicate glass (USG) film, or a high density plasma (HDP) oxide film. The second buffer layer 14 may include a film including carbon and hydrogen or a film including carbon, hydrogen, and oxygen. In an implementation, the second buffer layer 14 may include an amorphous carbon layer (ACL). The third buffer layer 16 may include a material having an etch selectivity with respect to the second buffer layer 14. In an implementation, the third buffer layer 16 may include a silicon oxide film, a silicon nitride film, or a polysilicon film.

Figure 9A:
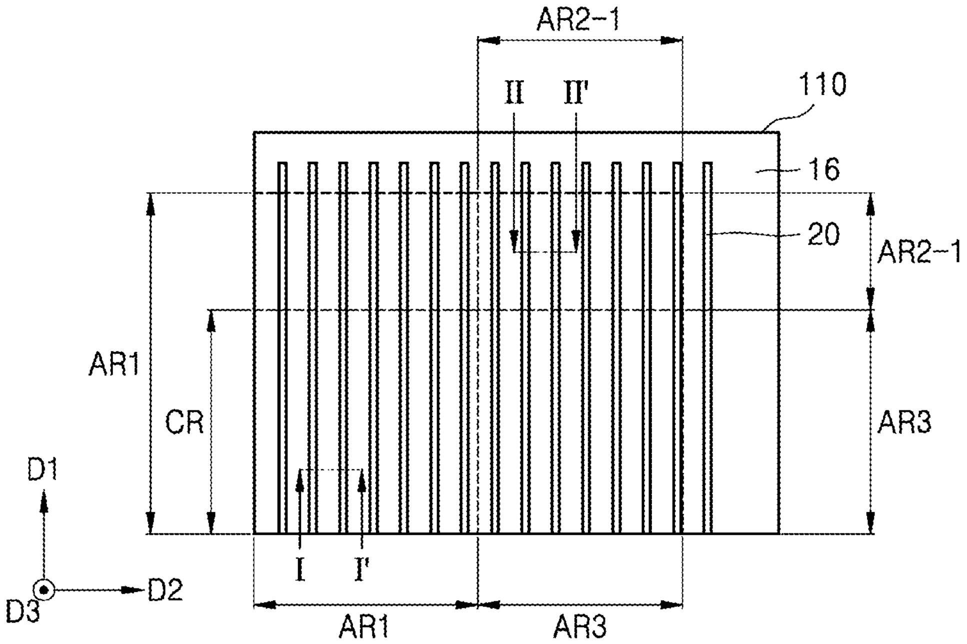
Figure 9B:
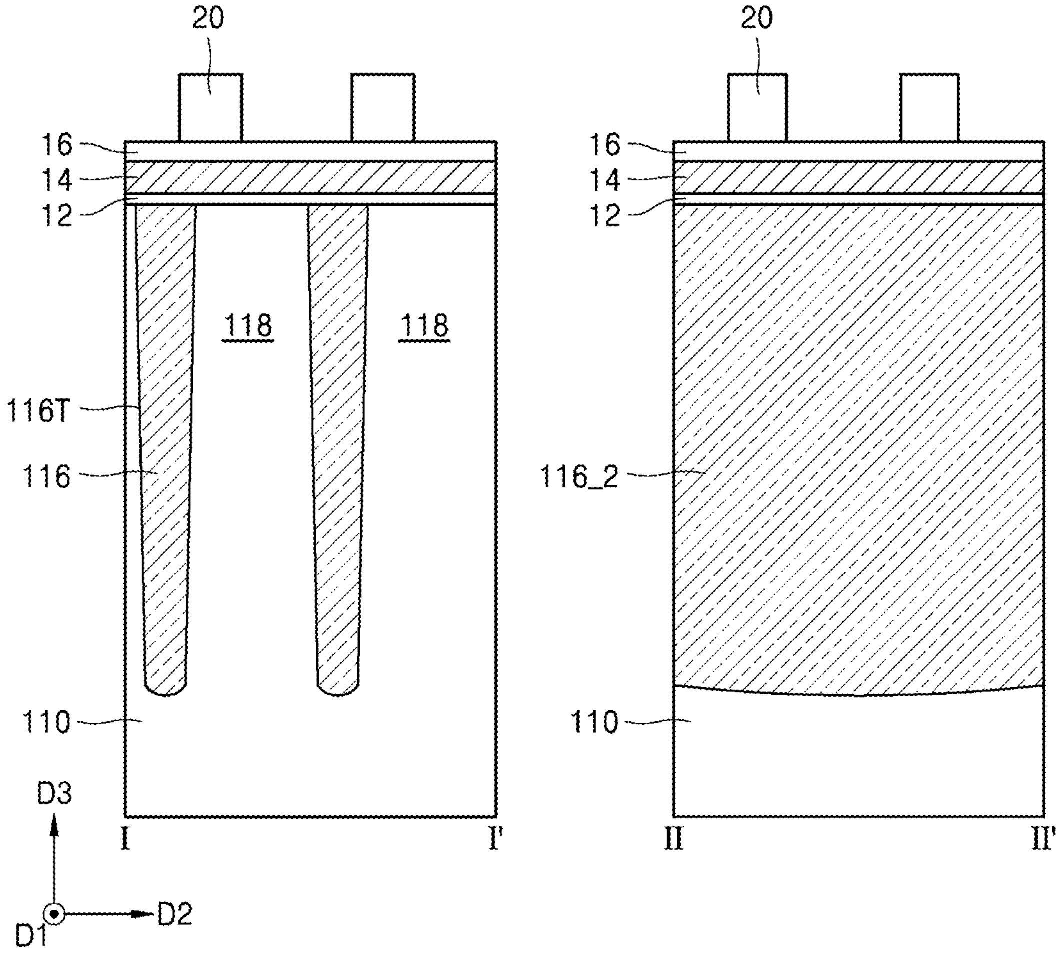

Referring to FIGS. 9A and 9B, a first mask pattern 20 may be on the third buffer layer 16 in the first area AR1 and the first sub-area AR2-1. The first mask pattern 20 may extend in the first direction D1. The first mask pattern 20 may be apart from an adjacent first mask pattern 20 in the second direction D2. A plurality of first mask patterns 20 may be parallel to one another. In terms of a plane, the first mask pattern 20 may overlap active regions. A width of the first mask pattern 20 may determine a separation distance between trenches in a post-process. The first mask pattern 20 may include a material having an etch selectivity with respect to the third buffer layer 16. The first mask pattern 20 may include a spin on hard mask (SOH) layer. The SOH layer may include a carbon-based SOH (C—SOH) layer or a silicon-based SOH (Si—SOH) layer.

Figure 10A:
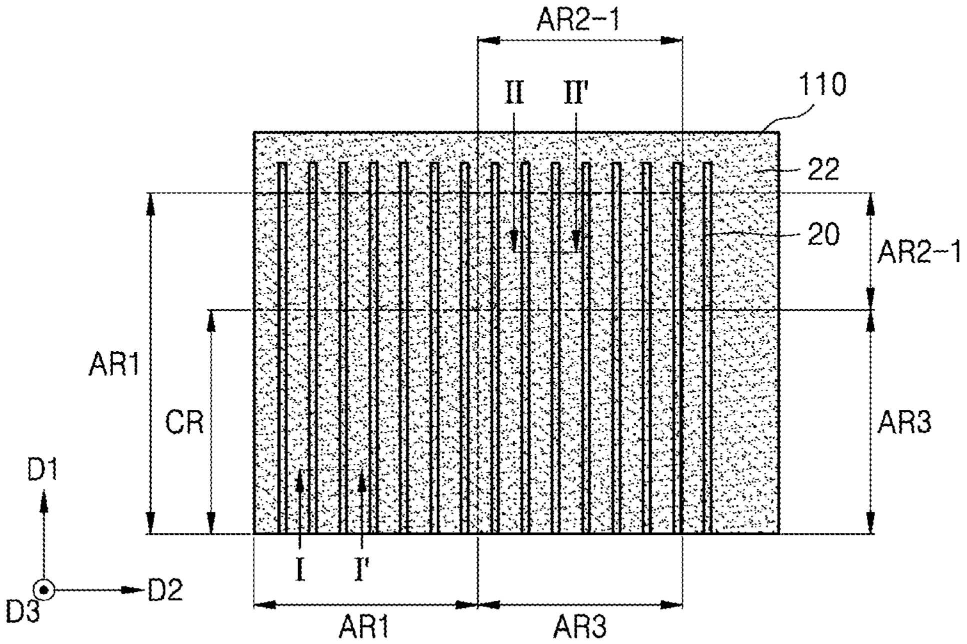
Figure 10B:
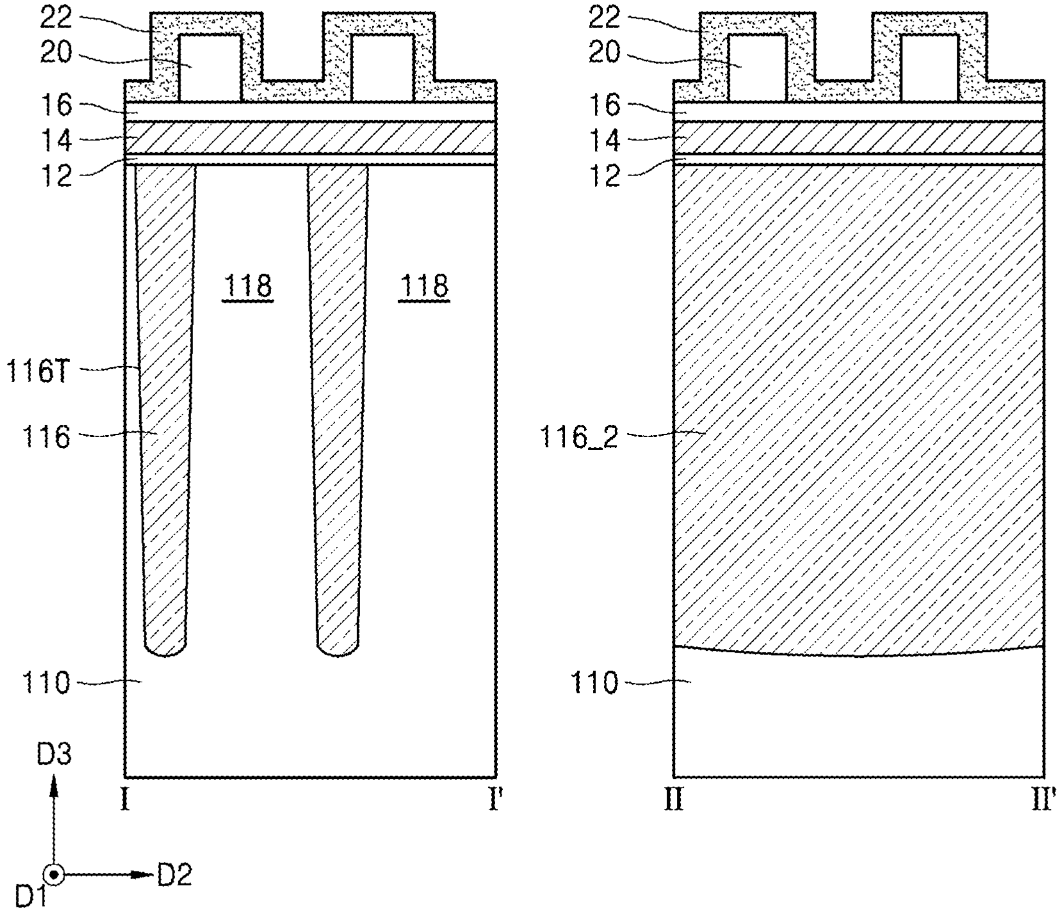

Referring to FIGS. 10A and 10B, a sacrificial layer 22 covering the substrate 110 in the first area AR1 and the first sub-area AR2-1 may be formed. The sacrificial layer 22 may cover sidewalls and an upper surface of the first mask pattern 20. The sacrificial layer 22 may cover an upper surface of the third buffer layer 16 exposed between adjacent first mask patterns 20. An upper surface of the sacrificial layer 22 covering the third buffer layer 16 may be lower than the upper surface of the first mask pattern 20. A thickness of the sacrificial layer 22 may determine widths of trenches in the substrate 110 in a post-process. The sacrificial layer 22 may be formed by an atomic layer deposition (ALD) process. The sacrificial layer 22 may include a silicon oxide film.

Figure 11A:
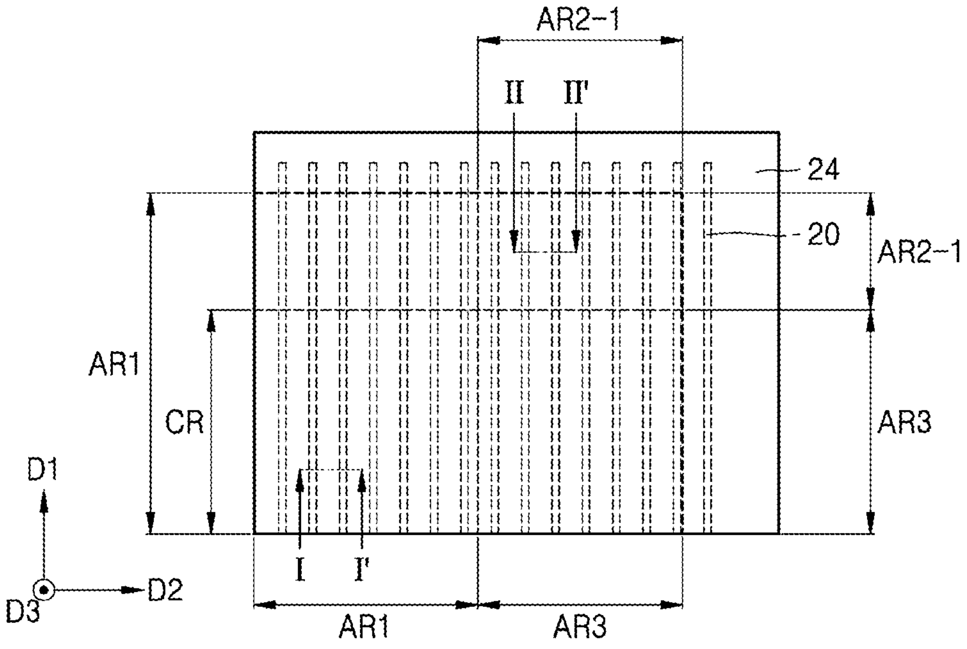
Figure 11B:
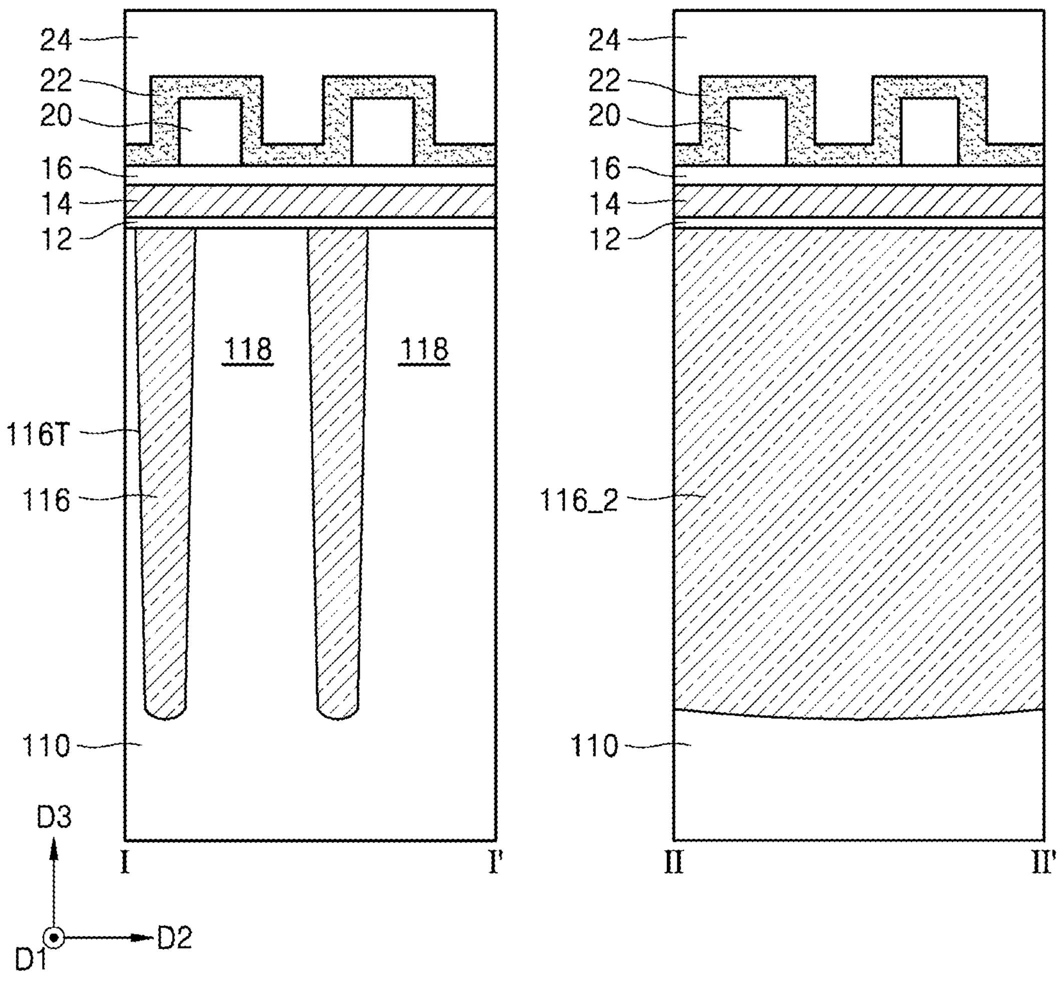

Referring to FIGS. 11A and 11B, a mask layer 24 may be on the sacrificial layer 22 in the first area AR1 and the first sub-area AR2-1. The mask layer 24 may be formed to completely fill a region between adjacent first mask patterns 20. An upper surface of the mask layer 24 may be higher than the upper surface of the first mask pattern 20. The mask layer 24 may include an SOH layer. The SOH layer may include a C—SOH layer or a Si—SOH layer.

Figure 12A:
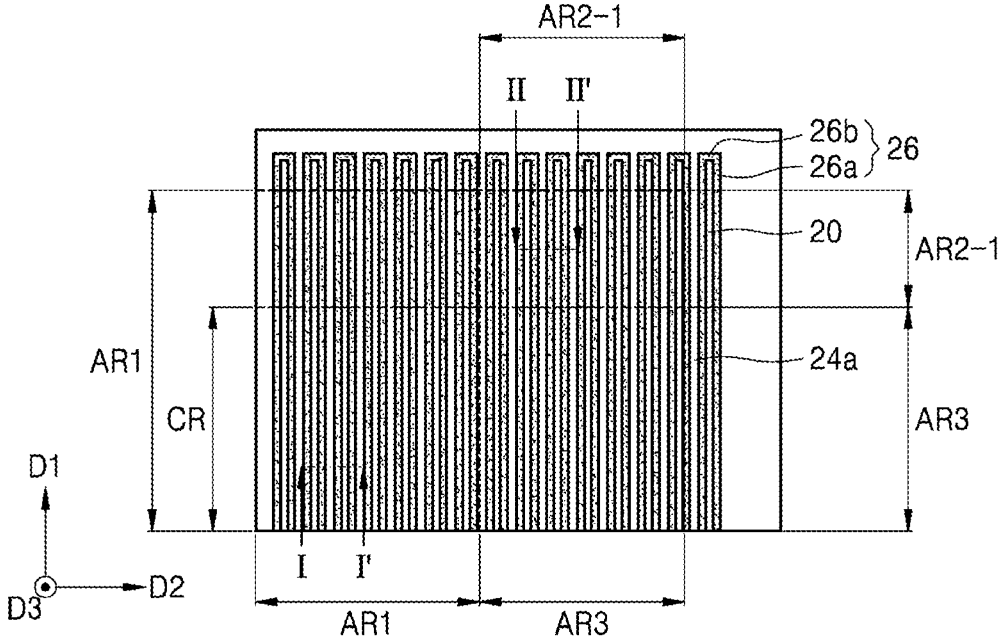
Figure 12B:
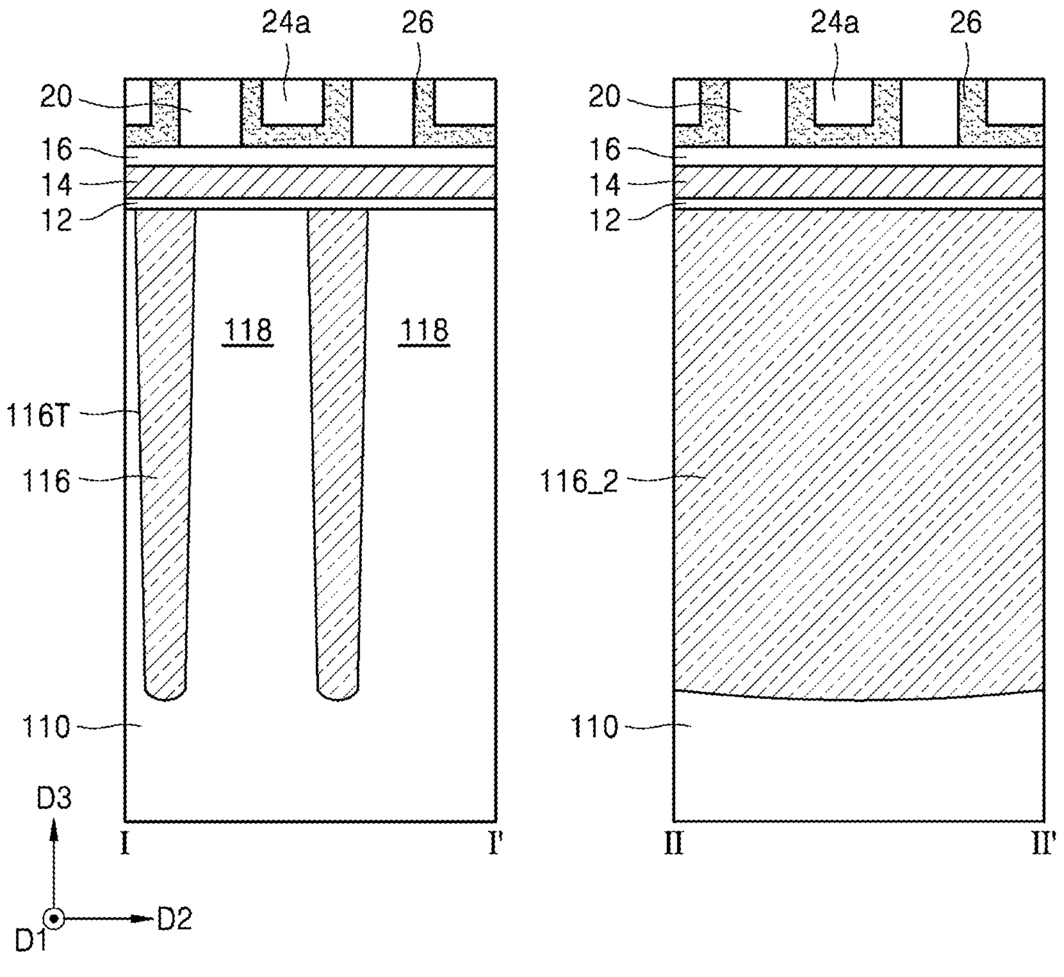

Referring to FIGS. 12A and 12B, an upper portion of each of the mask layer 24 (see FIG. 11A) and the sacrificial layer 22 (see FIG. 11A) in the first area AR1 and the first sub-area AR2-1 may be removed.

In some embodiments, the mask layer 24 may be removed by an etch-back process based on dry etching. A portion of the mask layer 24 may be removed, and thus, a second mask pattern 24*a* may be formed. The second mask pattern 24*a* may be formed between adjacent first second mask patterns 20. The second mask pattern 24*a* may extend in the first direction D1 on the substrate 110. The second mask pattern 24*a* may extend in the second direction D2. Therefore, in terms of a plane, the first second mask pattern 20 and the second mask pattern 24*a* may be alternately arranged. An upper surface of the second mask pattern 24*a* may have substantially the same height as the upper surface of the first mask pattern 20. A width of the second mask pattern 24*a* may determine a separation distance between trenches in a post-process.

Figure 13A:
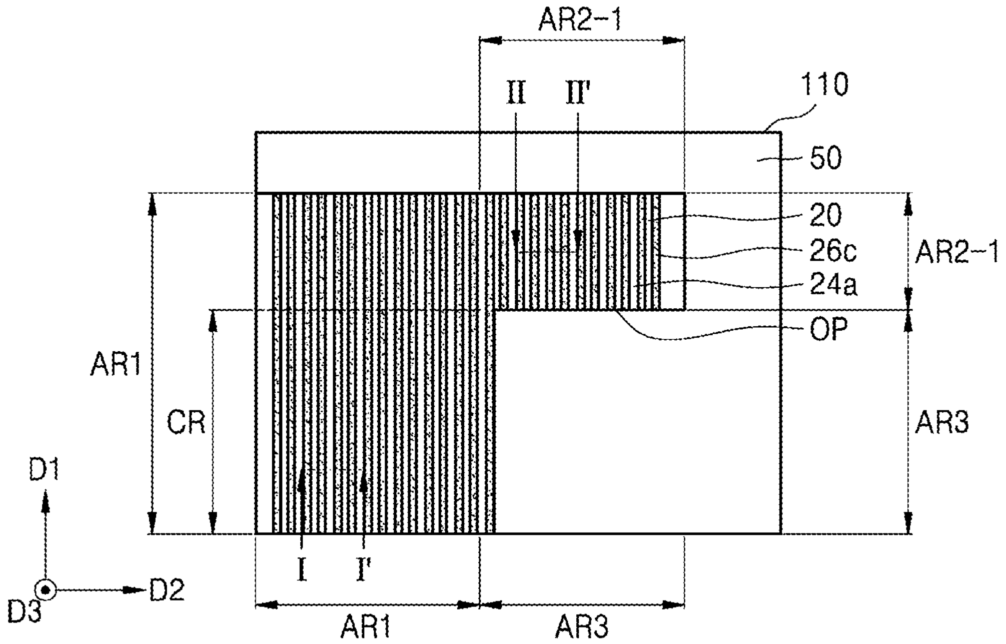
Figure 13B:
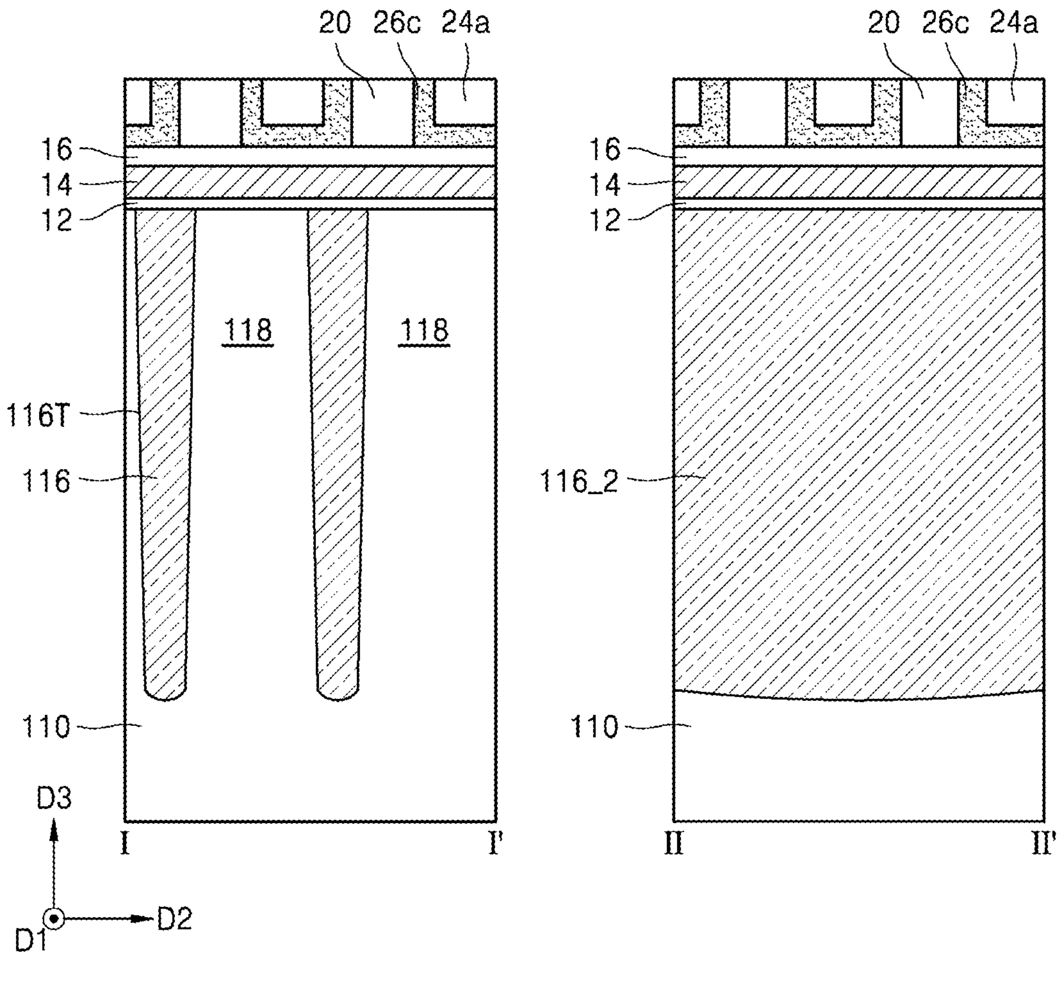

In some embodiments, an upper portion of the sacrificial layer 22 may be removed, and thus, the upper surface of the first mask pattern 20 may be exposed. A sacrificial pattern 26 may be formed between the first mask pattern 20 and the second mask pattern 24*a*. The sacrificial pattern 26 may include a pair of first sacrificial patterns 26*a* arranged in the second direction D2 and second sacrificial patterns 26*b* connecting the pair of first sacrificial patterns 26*a* with each other in the second direction D2. The sacrificial pattern 26 may be on a sidewall of the first mask pattern 20. Referring to FIGS. 13A and 13B, a trimming mask pattern 50 may be on the substrate 110. In some embodiments, the trimming mask pattern 50 may include a photoresist layer. The trimming mask pattern 50 may cover all of second sacrificial patterns 26*b* (see FIG. 12A) and some of first sacrificial patterns 26*a* (see FIG. 12A). The trimming mask pattern 50 may include an opening portion OP which may expose the first area AR1 and the first sub-area AR2-1.

A third sacrificial pattern 26*c* may be defined through the trimming mask pattern 50. The third sacrificial pattern 26*c* may be a first sacrificial pattern 26*c* which may not be covered by the trimming mask pattern 50. The third sacrificial pattern 26*c* may extend in the first direction D1. The third sacrificial pattern 26*c* may be apart from an adjacent third sacrificial pattern 26*c* in the second direction D2.

Figure 14A:
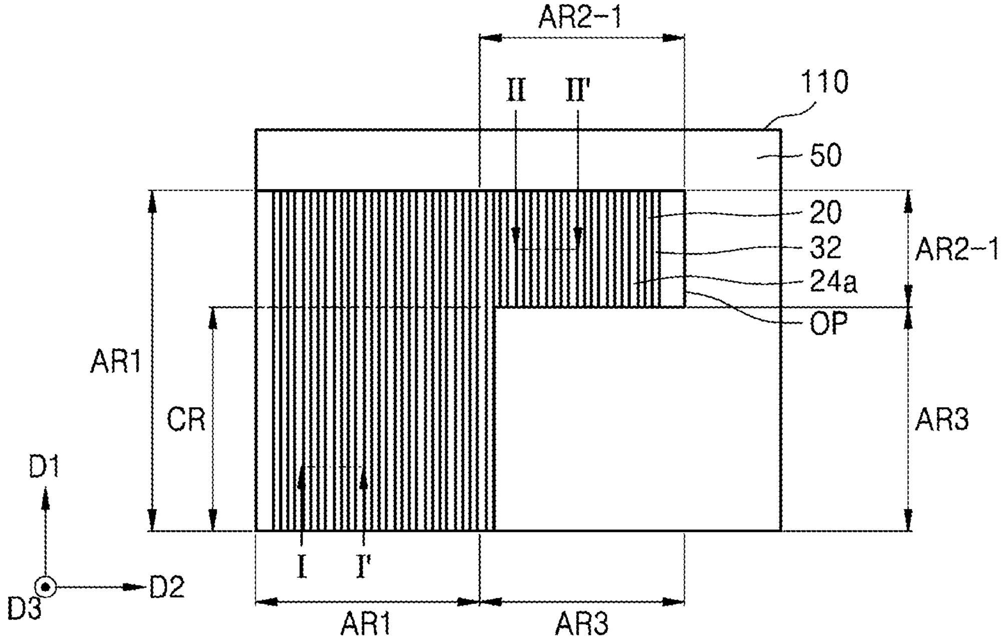
Figure 14B:
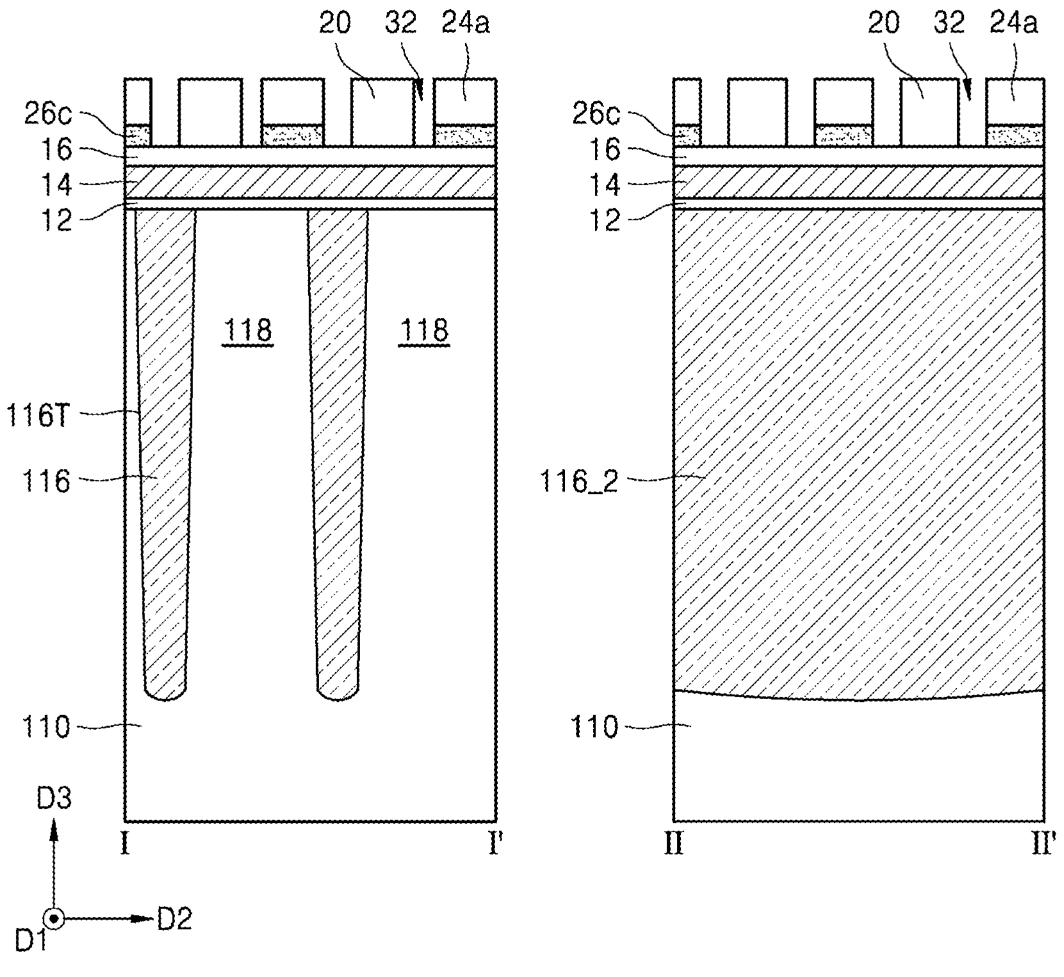

Referring to FIGS. 14A and 14B, by using the trimming mask pattern 50 as an etch mask, the third sacrificial pattern 26*c* in the first area AR1 and the first sub-area AR2-1 may be removed. The third sacrificial pattern 26*c* may be removed by a dry etching process. Accordingly, an upper surface of the third buffer layer 16 may be exposed. A first trench 32 may be formed between the first mask pattern 20 and the second mask pattern 24*a*. Some third sacrificial patterns 26*c* may remain between the third buffer layer 16 and the second mask pattern 24*a*. In some embodiments, while the third sacrificial pattern 26*c* is being etched, the first mask pattern 20 may be etched together.

Figure 15A:
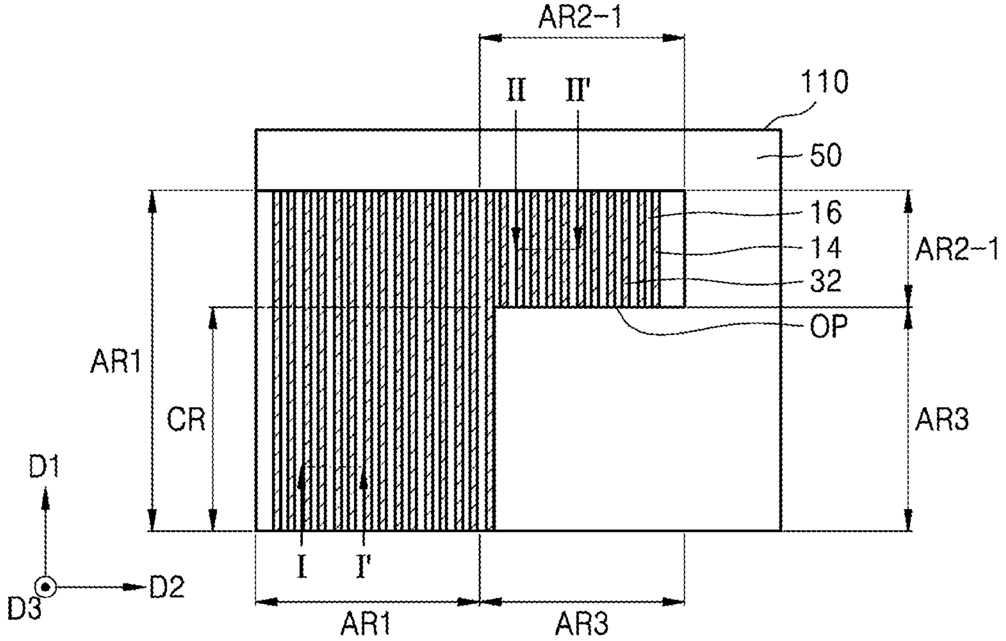
Figure 15B:
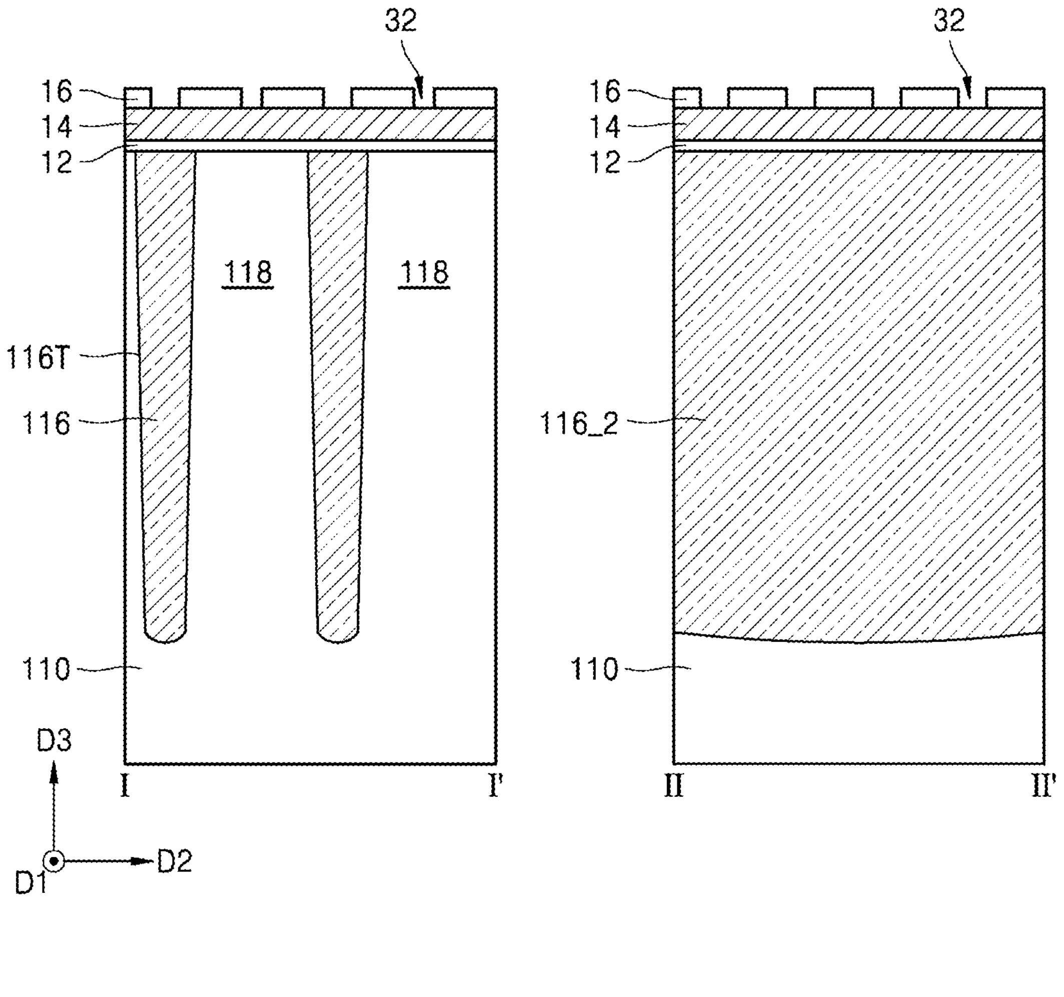

Referring to FIGS. 15A and 15B, the third buffer layer 16, where an upper surface thereof may be exposed, of each of the first area AR1 and the first sub-area AR2-1 may be etched by using the trimming mask pattern 50, the first mask pattern 20 (see FIG. 14B), and the second mask pattern 24*a* (see FIG. 14B) as an etch mask. An upper surface of the second buffer layer 14 may be exposed by etching the third buffer layer 16. While the third buffer layer 16 is being etched, the first mask pattern 20 and the second mask pattern 24*a* may be simultaneously etched and removed. The third buffer layer 16 which may not be etched may be exposed by etching the first mask pattern 20 and the second mask pattern 24*a*. A residual layer of each of the first mask pattern 20 and the second mask pattern 24*a* may remain on the third buffer layer 16 which may not be etched.

Figure 16A:
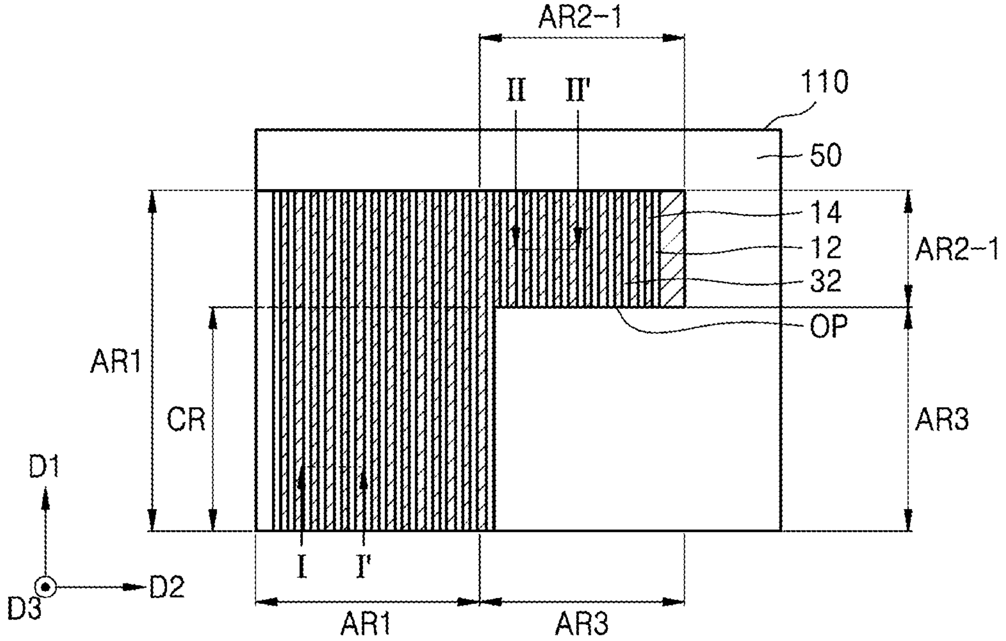
Figure 16B:
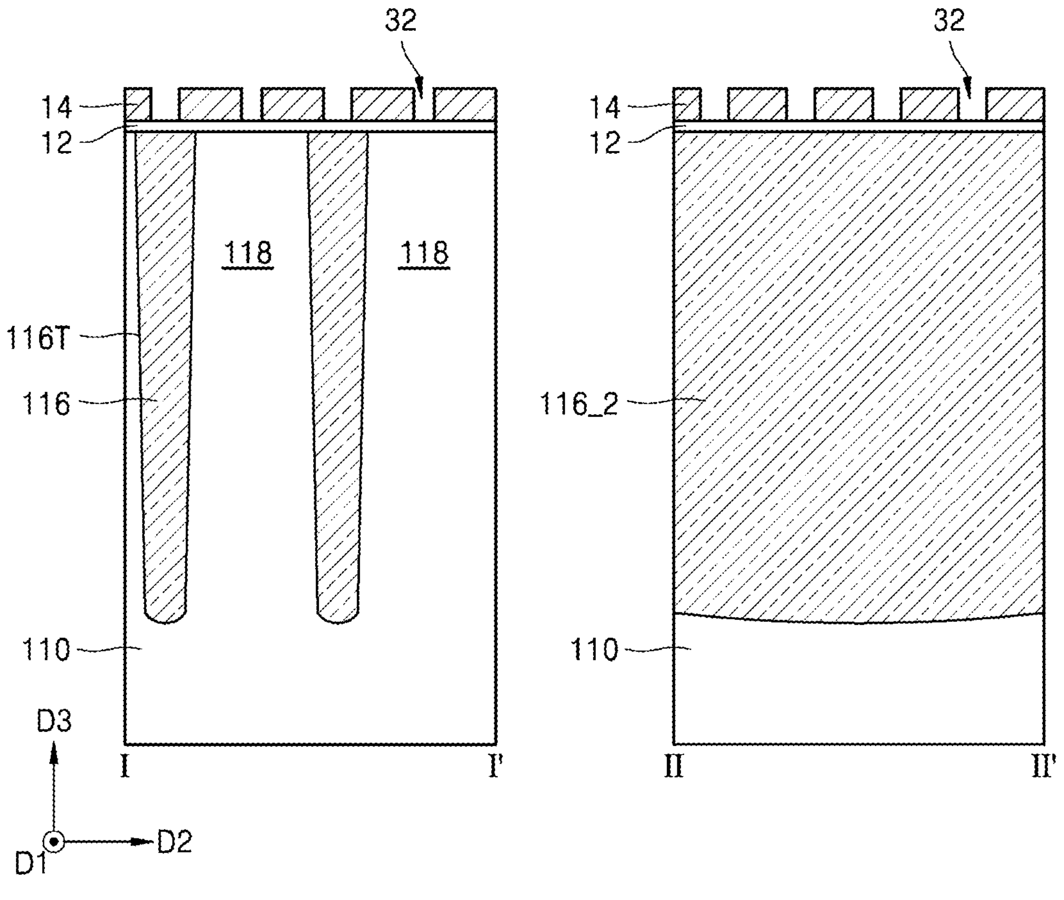

Referring to FIGS. 16A and 16B, the second buffer layer 14, where an upper surface thereof may be exposed, of each of the first area AR1 and the first sub-area AR2-1 may be etched by using the trimming mask pattern 50 and the third buffer layer 16 (see FIG. 15B) as an etch mask. An upper surface of the first buffer layer 12 may be exposed by etching the second buffer layer 14. While the second buffer layer 14 is being etched, the third mask pattern may be simultaneously etched and removed. The second buffer layer 14 which may not be etched may be exposed by etching the third buffer layer 16. A residual layer of the third buffer layer 16 may remain on the second buffer layer 14 which may not be etched.

Figure 17A:
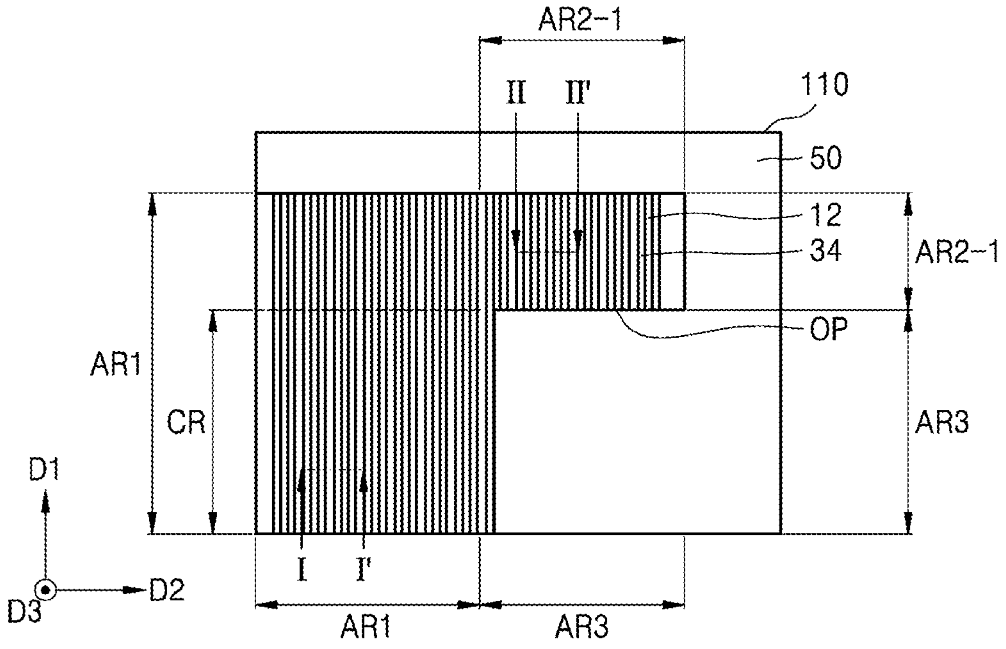
Figure 17B:
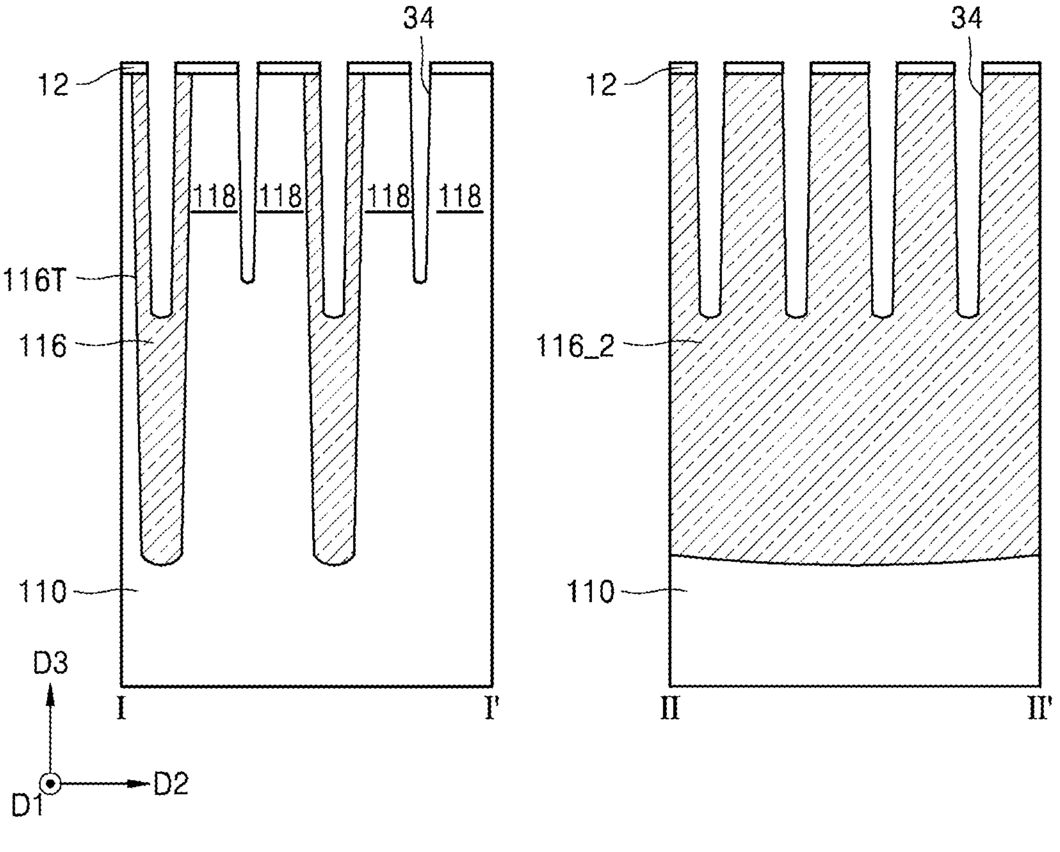

Referring to FIGS. 17A and 17B, the first buffer layer 12 including an exposed upper surface, the isolation layer 116, and the substrate 110 of each of the first area AR1 and the first sub-area AR2-1 may be sequentially etched by using the trimming mask pattern 50 and the second buffer layer 14 (see FIG. 16B) as an etch mask. Subsequently, all of the trimming mask pattern 50 and several layers under the trimming mask pattern 50 may be removed. Accordingly, a plurality of second trenches 34 may be in the substrate 110. The second trenches 34 may extend in the first direction D1. The second trenches 34 may be apart from one another in the second direction D2. While the substrate 110 and the first buffer layer 12 are being etched, the second buffer layer 14 may be simultaneously etched. Therefore, the second buffer layer 14 may be removed.

By way of summation and review, semiconductor devices having a high degree of integration are needed for electronic devices, and thus, design rules for elements of semiconductor devices are being reduced. Therefore, the level of difficulty of a manufacturing process for securing connection reliability between conductive patterns constituting a semiconductor device is progressively increasing. A semiconductor device where connection reliability between conductive patterns is secured is disclosed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:

a substrate;

an isolation layer defining an active region in the substrate;

a word line extending in a first horizontal direction in a first area of the substrate;

a bit line extending in a second horizontal direction perpendicular to the first horizontal direction, on the substrate; and a plurality of first dummy word lines provided in a second area of the substrate adjacent in the second horizontal direction to a first end portion of the first area in the first horizontal direction, the plurality of first dummy word lines extending in the first horizontal direction, wherein a length of each of the plurality of first dummy word lines in the first horizontal direction is less than a length of the word line in the first horizontal direction, and wherein the plurality of first dummy word lines extend in parallel in the first horizontal direction and are spaced apart from one another in the second horizontal direction without an operational word line therebetween.

2. The semiconductor device as claimed in claim 1, wherein each of the plurality of first dummy word lines does not overlap any active region of the substrate in a vertical direction.

3. The semiconductor device as claimed in claim 1, wherein the plurality of first dummy word lines includes 5 to 20 first dummy word lines arranged apart from one another in the second horizontal direction.

4. The semiconductor device as claimed in claim 1, further comprising:

a word line contact electrically connected with the word line, wherein the word line contact is at the first end portion of the first area in the first horizontal direction.

5. The semiconductor device as claimed in claim 4, wherein:

at least a portion of the word line contact does not overlap the word line in a vertical direction, and the word line contact does not overlap any of the plurality of first dummy word lines in the vertical direction.

6. The semiconductor device as claimed in claim 1, wherein the length of each of the plurality of first dummy word lines in the first horizontal direction is progressively shorter with increasing distance from the first area.

7. The semiconductor device as claimed in claim 1, wherein the second area further includes a plurality of second dummy word lines further provided adjacent to a second end portion of the first area in the second horizontal direction, the second end portion being opposite to the first end portion of the first area in the first horizontal direction, and the plurality of second dummy word lines are arranged apart from the plurality of first dummy word lines in the first horizontal direction.

8. The semiconductor device as claimed in claim 7, wherein the second area further includes a plurality of third dummy word lines further provided adjacent to the first end portion in the second horizontal direction and arranged apart from the plurality of first dummy word lines in the second horizontal direction with the first area therebetween.

9. The semiconductor device as claimed in claim 1, wherein the second area of the substrate is free of any operational word lines.

10. The semiconductor device as claimed in claim 1, wherein the first area of the substrate is free of dummy word lines.

11. A semiconductor device, comprising:

a substrate;

an isolation layer defining an active region in the substrate;

a word line extending in a first horizontal direction in a first area of the substrate;

a bit line extending in a second horizontal direction perpendicular to the first horizontal direction, on the substrate;

a plurality of first dummy word lines provided in a second area of the substrate adjacent in the second horizontal direction to a first end portion of the first area in the first horizontal direction, the plurality of first dummy word lines extending in the first horizontal direction; and a word line contact electrically connected with the word line, wherein:

the word line contact is at the first end portion of the first area in the first horizontal direction, a length of each of the plurality of first dummy word lines in the first horizontal direction is less than a length of the word line in the first horizontal direction, at least a portion of the word line contact does not overlap the word line in a vertical direction, and the word line contact does not overlap any of the plurality of first dummy word lines in the vertical direction.

* * * * *